(12) United States Patent
Tamura et al.

(10) Patent No.: US 7,255,354 B2
(45) Date of Patent: Aug. 14, 2007

(54) GAS-PERMEABLE PLUG AND METHOD FOR MANUFACTURING THE SAME

(75) Inventors: Tatsuya Tamura, Obu (JP); Kouichi Hara, Obu (JP)

(73) Assignee: Tokai Kogyo Company Limited, Aichi-Pref. (JP)

( * ) Notice: Subject to any disclaimer, the term of this patent is extended or adjusted under 35 U.S.C. 154(b) by 568 days.

(21) Appl. No.: 10/163,590

(22) Filed: Jun. 7, 2002

(65) Prior Publication Data

US 2002/0190428 A1    Dec. 19, 2002

(30) Foreign Application Priority Data

Jun. 14, 2001 (JP) ............................. 2001-180410
Dec. 12, 2001 (JP) ............................. 2001-378054

(51) Int. Cl.
B65D 51/16 (2006.01)
B65D 53/00 (2006.01)

(52) U.S. Cl. ................. 277/650; 277/928; 220/203.13; 220/801; 220/371; 215/261; 55/385.4

(58) Field of Classification Search ................ 277/650, 277/928; 220/203.11, 203.13, 203.16, 796, 220/801, 371, 373; 215/261; 429/53, 54, 429/86; 55/385.4
See application file for complete search history.

(56) References Cited

U.S. PATENT DOCUMENTS 3,884,722 A * 5/1975 Tucholski .................... 429/54
3,951,293 A * 4/1976 Schulz ........................ 215/261
4,187,390 A * 2/1980 Gore ....................... 174/102 R
4,636,446 A * 1/1987 Lee ............................. 429/54
4,859,546 A * 8/1989 Binder et al. ................. 429/53
4,957,518 A    9/1990 Brassell
5,215,312 A * 6/1993 Knappe et al. ............. 277/312
5,407,760 A * 4/1995 Kasner et al. ................ 429/54
5,476,589 A * 12/1995 Bacino .................. 210/500.36

(Continued)

FOREIGN PATENT DOCUMENTS

DE           3622773        *  1/1988

(Continued)

OTHER PUBLICATIONS

Patent Abstracts of Japan Publication No. 10-328521, Publication date Dec. 15, 1998.

(Continued)

Primary Examiner—Alison K Pickard
(74) Attorney, Agent, or Firm—Wenderoth, Lind & Ponack, L.L.P.

(57) ABSTRACT

A gas-permeable plug is adapted to be inserted in an insertion hole formed through a part of a casing in an inward-outward direction. The gas-permeable plug has a plug body and a permeable sheet including therein countless minute permeable pores. The plug body is injection molded from a material having rubber-like elasticity and the permeable sheet is integrally bonded to a sheet bonding portion by an anchor operation such that when the plug body is injection molded, at the sheet bonding portion, a part of a heat-melted liquid resin enters the minute permeable pores and/or the permeable gaps in irregular directions by the injection molding pressure and is solidified.

14 Claims, 12 Drawing Sheets

U.S. PATENT DOCUMENTS

| | | | |
|---|---|---|---|
| 5,522,769 A * | 6/1996 | DeGuiseppi | 454/270 |
| 5,556,541 A * | 9/1996 | Ruschke | 210/232 |
| 5,578,491 A * | 11/1996 | Kayal et al. | 435/288.1 |
| 5,725,645 A | 3/1998 | Wickland et al. | |
| 5,891,223 A | 4/1999 | Shaw et al. | |
| 5,914,415 A | 6/1999 | Tago | |
| 6,092,812 A | 7/2000 | Ursel et al. | |
| 6,360,540 B1 * | 3/2002 | Kottmyer | 60/585 |
| 6,368,741 B1 * | 4/2002 | Hackel et al. | 429/53 |
| 6,468,332 B2 | 10/2002 | Goglio et al. | |
| 6,524,361 B1 | 2/2003 | Thornton et al. | |
| 6,827,232 B1 * | 12/2004 | Hara et al. | 220/371 |

FOREIGN PATENT DOCUMENTS

| | | | |
|---|---|---|---|
| DE | 3933877 A | | 4/1990 |
| DE | 19702685 A | | 7/1998 |
| EP | 0 326 812 | | 8/1989 |
| EP | 0 377 067 | | 7/1990 |
| EP | 0 484 288 | | 5/1992 |
| EP | 0522183 A | | 1/1993 |
| EP | 0600271 A | | 6/1994 |
| EP | 0856897 | * | 8/1998 |
| EP | 1133222 A | | 9/2001 |
| JP | 62-181766 | | 11/1987 |
| JP | 6-31130 | | 2/1994 |
| SE | 9900116 A | * | 7/2000 |
| WO | 01/20958 | | 3/2001 |

OTHER PUBLICATIONS

Patent Abstracts of Japan Publication No. 02-151097, Publication date Jun. 11, 1990.

* cited by examiner

GAS-PERMEABLE PLUG AND METHOD FOR MANUFACTURING THE SAME

FIELD OF THE INVENTION

The present invention relates to a gas-permeable plug used for a casing which is required to have such performance that although permeation is possible between the plug's inside and outside, foreign matter, such as a water droplet or dust does not infiltrate into the inside of the plug, and a method for manufacturing the same.

BACKGROUND ART

As a typical example in which the performance as stated above is required, there is a casing of an electric motor for a power window disposed in the inside of a door of a vehicle. That is, even when a vehicle falls in water because of an accident or the like, in order to enable a passenger to escape, it is desired that even if the electric motor is submerged, the electric motor can be operated by a switch operation from the inside of the vehicle for a certain time (for example, five minutes) after the submergence, so that the window can be opened.

For this purpose, when the casing is completely sealed by a sealant or the like, the object of preventing the infiltration of water can be achieved. However, in normal use, heat generation from the operation of the motor causes the air inside of the casing to be heated and expanded, and there occurs such a problem that a sealing portion of the casing is broken by the air expansion. Once the sealing portion is broken, the passage of water at this portion can occur, and it becomes difficult to achieve the object of preventing the infiltration of water.

In order to solve the problem, it is proposed that a vent hole is formed through a part of a casing in an inward-outward direction and this vent hole is closed with a permeable sheet.

This permeable sheet has such minute permeable pores (their size being 0.05 to 20 µm) as to allow gas (oxygen gas, nitrogen gas, etc.) constituting the air, and moisture or water vapor (its size being 0.0004 µm) in the air to pass through, and to prevent the passing of even the smallest water droplet (water droplet of a drizzle state having a size of 100 µm). The permeable sheet is bonded to the vent hole portion of the casing by a doughnut-shaped adhesive agent or tackiness agent.

However, at the bonding portion, the performance of the adhesive agent or the tackiness agent deteriorates in long-term use, the bonding portion peels off, and water is able to infiltrate through the peeled portion. Further, there still remains a problem that the consistency of quality is lacking.

Besides, in the bonding work of the permeable sheet, since an adhesive agent or a tackiness agent is used and the bonding is carried out in a pressing state, the pressing force applied to this portion is liable to be partially varied, and this variation also becomes a factor negatively effecting the bonding quality. Further, since the permeable sheet is thin and small, the adhesion work is complicated, and excessive attention is needed for the adhesion work in order to avoid damage to the permeable sheet.

SUMMARY OF THE INVENTION

In view of the above problems, a first object of the invention is to provide a gas-permeable plug which has a simple structure, does not cause peeling or the like at a bonding portion, and can maintain high and consistent quality over a long term, and a method for manufacturing the same. A second object thereof is to provide a method which enables the manufacture of the gas-permeable plug economically and simply. Further, a third object thereof is to provide a gas-permeable plug which can be inserted into an insertion hole of an attachment object without damaging or deteriorating the bonding portion of a permeable sheet and the permeable sheet itself.

In order to achieve the objects, a first aspect of the invention is a gas-permeable plug which is inserted in an insertion hole formed through a part of a casing in an inward-outward direction. The plug comprises a plug body, and a permeable sheet including therein countless minute permeable pores directed in irregular directions and/or countless fine permeable gaps directed in irregular directions. The plug and is characterized in that the plug body is injection molded from a material having rubber-like elasticity. A vent hole is formed through a center portion of the plug body in the inward-outward direction of the casing, and a sheet bonding portion is formed outside the vent hole. The plug body is injection molded into a substantially ring shape or tubular shape having an outer shape slightly larger than an inner shape of the insertion hole, and the permeable sheet is integrally bonded to the sheet bonding portion by an anchor operation such that when the plug body is injection molded, at the sheet bonding portion, part of a heat molten liquid synthetic resin enters the minute permeable pores and/or the permeable gaps in irregular directions by the injection molding pressure and is solidified to close the vent hole of the plug body to be permeable.

According to the first aspect of the invention, the permeable sheet is bonded to the sheet bonding portion of the plug body in a state (anchor state) in which part of the resin is pressure injected uniformly and in irregular directions to the countless minute permeable pores directed in irregular directions in the inside of the permeable sheet and/or the countless fine permeable gaps directed in irregular directions. Since the permeable sheet is bonded to the sheet bonding portion of the plug body by the anchor operation of the injected resin, as compared with the conventional case where bonding is only made by an adhesive agent or tackiness agent, the bonding portion does not deteriorate, the bonding strength is high, and consistent fixing performance can be obtained for a long period.

Further, since the bonding of the permeable sheet to the plug body is a mechanical coupling due to the anchor operation, a resin having no adhesive property or a poor adhesive property can also be used, and the choices of resin that can be used are increased. To this point, in the conventional adhesion structure, a resin material of a molded product is restricted to a resin to which an adhesive agent or tackiness agent can be applied. For example, in a case where the molded product is formed of a polyolefin resin having a generally poor adhesive property, there remains a fear regarding adhesion performance and quality.

Here, in the invention, "gas-permeable" means that although a gas, such as the air, moisture and water vapor in the air is allowed to pass through, a water droplet or the like is not allowed to pass through. Accordingly, "permeable sheet", especially "permeable sheet body," means a sheet having the ability to perform the foregoing operation. As a specific structure of the permeable sheet, the permeable sheet body is almost spongy over the whole surface of the sheet, and includes countless minute permeable pores directed in irregular directions in its inside. The size of the minute permeable pores is 0.05 µm to 20 µm, a volume ratio of occupation of the minute permeable pores is 10 to 95%, and the minute permeable pores are continuously arranged in a sheet-form in a direction to pass through the sheet. By this, the permeable sheet bonded at the time of injection molding to the sheet bonding portion of the outer peripheral portion of the vent hole of the plug body allows moisture or water vapor having a size of 0.0004 µm in the air, and atmospheric gas (nitrogen gas, oxygen gas) smaller than this to pass through a place other than the bonding portion. However, this prevents the passing of a liquid, such as a water droplet or an oil droplet, having a size of 100 µm (almost equal to a size of drizzle) or larger, and a solid foreign substance, such as dust, having a size exceeding 20 µm. Here, in this invention, the technical term of "resin" includes materials with a rubber-like elasticity, and "thermoplastic elastomer resin" is often called only "thermoplastic elastomer (material)", etc.

A second aspect of the invention is a gas-permeable plug which is inserted into an insertion hole formed through a part of a casing in an inward-outward direction. The plug comprises a plug body, a permeable sheet including therein countless minute permeable pores directed in irregular directions and/or countless fine permeable gaps directed in irregular directions, and a substantially tubular reinforcing body for reinforcing a sheet bonding portion of the plug body to which the permeable sheet is integrally bonded. The plug is characterized in that the plug body is injection molded from a material having rubber-like elasticity, a vent hole is formed through a center portion of the plug body in the inward-outward direction of the casing, and an annular groove enabling the reinforcing body to be disposed outside the sheet bonding portion is formed outside the vent hole. The plug body is injection molded into a substantially ring shape or tubular shape having an outer shape slightly larger than an inner shape of the insertion hole. The permeable sheet is integrally bonded to the sheet bonding portion by an anchor operation such that when the plug body is injection molded, at the sheet bonding portion, part of a heat-melted liquid synthetic resin enters the minute permeable pores and/or the permeable gaps in irregular directions by the injection pressure and is solidified to close the vent hole of the plug body to be permeable, and the reinforcing body is fitted to an outside of the sheet bonding portion of the plug body in a state where it is disposed in the annular groove to reinforce the sheet bonding portion.

According to the second aspect of the invention, even if an external force is applied to the plug body from the outside of the vent hole in the radial direction, since the outside of the sheet bonding portion to which the permeable sheet is integrally bonded is reinforced by the reinforcing body, the external force becomes difficult to apply to the bonding portion of the permeable sheet, and its deformation is suppressed, and the deformation of the permeable sheet due to peeling of the permeable sheet, or formation of wrinkles, broken lines, etc. can be prevented. Accordingly, at the time of attachment of the gas-permeable plug, even if a nipping force is applied to the plug body from the outside of the vent hole in the radial direction by human hands or hands of a mechanical apparatus, since the deformation is not exerted on the permeable sheet and the bonding portion, the permeable sheet does not peel off, the permeable performance is not lowered, and consistent permeable performance can be maintained. In addition, at the time the gas-permeable plug is used, compression force from the inside of the hole of the attachment object in the radial direction is not exerted on the permeable sheet and the bonding portion.

A third aspect of the invention is characterized in that in the second aspect of the invention, the reinforcing body has a substantially bottom-closed cylindrical shape in which a cover portion covering an outside of the permeable sheet is integrally provided.

According to the third aspect of the invention, in addition to the operation and effect of the second aspect of the invention, even if an outside substance approaches the gas-permeable plug, since the probability of the substance coming in direct contact with the permeable sheet can be decreased, a damage probability of the permeable sheet at the time of attachment of the gas-permeable plug and at the time of use becomes low. Besides, when the gas-permeable plug is pushed and inserted into the hole of the attachment object, the danger that an inserting tool (when a hand is used, fingers, or when an inserting tool of a machine/implement etc. is used, the inserting tool) will come into contact disappears.

A fourth aspect of the invention is characterized in that in the third aspect of the invention, the cover portion of the reinforcing body is provided with a vent hole formed through the cover.

According to the fourth aspect of the invention, in addition to the operation and effect of the third aspect, the cover portion of the reinforcing body protecting the permeable sheet has venting enabled between its inside and its outside, and lowering of permeability is prevented.

A fifth aspect of the invention is characterized in that in any one of the first to fourth aspects, an annular groove having a bottom surface positioned closer to an inside of the casing than the permeable sheet is formed at an outer peripheral side of the sheet bonding portion of the plug body. Further, the sheet bonding portion of the plug body and a body portion of an outermost periphery are coupled with each other through an annular thin coupling portion.

According to the fifth aspect of the invention, in addition to the operation and effect of any one of the first to fourth aspects of the invention, when the plug is inserted in the insertion hole of the casing, the sheet bonding portion of the plug body to which the permeable sheet is bonded is separated by the existence of the annular groove from the body portion positioned outside this, so that the deformation of the body portion is not directly exerted on the permeable sheet. Therefore, the permeable sheet does not receive compression force in its surface direction. Thus, wrinkles and broken lines are not formed in the permeable sheet (when a broken line is formed in the permeable sheet, this portion becomes weak, its durability is lowered, and breakage is apt to occur at the broken line portion).

Besides, when the plug is inserted into the insertion hole of the casing, since the body portion of the outermost periphery of the plug body is compressed, the portion of the sheet bonding portion of the plug body is slightly deformed so as to rotate around the thin coupling portion toward the outside in the radial direction. Consequently, in all parts of the permeable sheet in the surface direction, a slight tensile force is applied towards the outside in the radial direction, and the permeable sheet is held in a state where it is stretched outward in the radial direction. That is, since the sheet bonding portion of the plug body and the body portion of the outermost periphery are coupled with each other through the annular thin coupling portion, at the time of insertion of the plug, the body portion of the outermost periphery of the plug body is compressed, so that the compression force in the surface direction is not applied to the permeable sheet, and the wrinkles or broken lines are prevented from being formed.

A sixth aspect of the invention is characterized in that in the fifth aspect of the invention, a projection projecting toward the inside of the casing is formed at an inner end surface of the plug body and at a portion facing the vent hole.

According to the sixth aspect of the invention, in addition to the operation and effect of the fifth aspect of the invention, in a case where the plug is inserted into the insertion hole of the casing, the projection provided on the plug body comes in contact with the bottom surface of the insertion hole of the casing to displace the sheet bonding portion as the outside portion of the vent hole of the plug body outward. As a result, all parts, in the surface direction, of the permeable sheet integrally bonded to the sheet bonding portion are displaced outward in the radial direction, and a tensile force in the surface direction is given to the permeable sheet. By this operation, the center portion of the permeable sheet is not compressed in the surface direction, so that formation of wrinkles or the like is effectively prevented, and the original function of the permeable sheet can be effectively performed.

A seventh aspect of the invention is characterized in that in any one of the first to sixth aspects of the invention, a permeable sheet body of the permeable sheet is singly bonded to the sheet bonding portion of an outside of the vent hole of the plug body. The sheet body is fixed to the sheet bonding portion by the anchor operation produced by entrance of part of the resin forming the plug body into the minute permeable pores of the permeable sheet body in irregular directions.

According to the seventh aspect of the invention, in addition to the operation and effect of any one of the first to sixth aspects of the invention, since the permeable sheet body is singly bonded, a molded product having previously designed permeable performance can be obtained without changing the permeable performance of gas or the like, which the permeable sheet body has. Besides, since the permeable sheet body is singly used, the permeable plug can be made inexpensively.

An eighth aspect of the invention is characterized in that in any one of the first to sixth aspects of the invention, the permeable sheet has a structure having a backing sheet including countless fine permeable gaps directed in irregular directions that is laminated on at least one surface of a permeable sheet body, and at the sheet bonding portion of the plug body, the backing sheet is fixed by the anchor operation such that part of the resin of the plug body enters the fine permeable gaps in irregular directions and is solidified.

According to the eighth aspect of the invention, in addition to the operation and effect of any one of the first to sixth aspects, the backing sheet is laminated by heat roller compression bonding or the like on at least one surface of the permeable sheet body and is integrated external force exerted on the permeable sheet is also received by the backing sheet, so that the strength becomes higher than the case with only the permeable sheet body, and consequently, the durability of the permeable sheet is raised. Since the permeable gaps of the backing sheet are larger than the minute permeable pores of the permeable sheet body, molten liquid resin will enter the permeable gaps of backing sheet, so that fixing of the permeable sheet to the plug body becomes certain.

When backing sheets are laminated on both surfaces of the permeable sheet body, the inner single surface (inner backing sheet) is used for bonding to the sheet bonding portion of the plug body, and the outer single surface (outer backing sheet) can be made to function as a protective sheet to prevent external force from being directly exerted on the permeable sheet body. Further, the outer backing sheet can be subjected to a water repellent or oil repellent treatment, and even if a water droplet or oil droplet adheres to the permeable sheet, the sheet repels the droplet and prevents the adhesion, so that the permeable performance is not damaged, and the original permeable performance can be exhibited. As stated above, in the case where the backing sheet is used, in accordance with a use and an object of equipment in which the plug is inserted, a water-repellent property, an oil-repellent property or the like can be performed on the backing sheet by a separate surface treatment. Accordingly, for example, when the outer and inner backing sheets are respectively subjected to the respective water-repellent and oil-repellent treatments, a preferable plug applied to a casing of equipment using lubricating oil or the like can be provided.

A ninth aspect of the invention is characterized in that in any one of the first to eighth aspects of the invention, the permeable sheet is compressed in a thickness direction at the sheet bonding portion of the plug body, and becomes thinner than its original thickness.

According to the ninth aspect of the invention, in addition to the operation and effect of any one of the first to eighth aspects of the invention, the minute permeable pores and/or the permeable gaps of the permeable sheet at the bonding portion are crushed and become smaller than those at the center portion which are not crushed and compressed, and part of the resin enters the minute permeable pores and/or the permeable gaps, so that permeation resistance against air, water droplets or the like is raised, and as a result, the seal property, water proof property or the like at the bonding portion is raised. Thus, the seal property and water proof property of the permeable sheet are raised at the bonding portion in both the surface direction of the sheet and the thickness direction, and the infiltration of water, water droplets or the like from the outside can be more effectively prevented.

A tenth aspect of the invention is characterized in that in the ninth aspect of the invention, the compressed portion of the permeable sheet is annular and continuous.

According to the tenth aspect of the invention, in addition to the operation and effect of the ninth aspect of the invention, since the vicinity of the outer periphery of the vent hole in the permeable sheet is annularly compressed, the seal property, water proof property and the like in the whole periphery of the vicinity of the bonding portion are raised.

An eleventh aspect of the invention is characterized in that in any one of the first to tenth aspects of the invention, the plug body is injection molded from thermoplastic elastomer resin material.

According to the eleventh aspect of the invention, in addition to the operation and effect of any one of the first to tenth aspects of the invention, even when the thermoplastic elastomer resin is of either olefinic type or styrene type, since a component of EPDM or the like is contained in the material, in the case where the plug body is inserted in the casing of equipment and is used, stable rubber-like elasticity is exhibited in a wide range of temperatures to which it is exposed. As a result, wrinkles or the like are not formed in the permeable sheet by temperature change, and consistent permeable performance can be exhibited. Since the thermoplastic elastomer resin can be injection molded, it is generally an inexpensive material that is easy to get, and the gas-permeable plug of the invention can be simply and economically manufactured. Further, since the injection molding temperature of the thermoplastic elastomer resin is about 250° C., heat deterioration does not occur in the permeable sheet set in a mold.

A twelfth aspect of the invention is characterized in that in any one of the first to eleventh aspects of the invention, the casing is a casing of a vehicle electric motor having an insertion hole provided through the casing in an inward-outward direction.

According to the twelfth aspect of the invention, in addition to the operation and effect of any one of first to eleventh aspects of the invention, in the case where an electric motor is housed in the casing of the vehicle electric motor, even if the motor casing sinks in water (especially, in sea water), since the water does not infiltrate into the casing, the inside electric motor does not suffer from poor operation, due to a short circuit caused by the water, and operates normally. In the case where the electric motor is used for driving of a windshield wiper of a vehicle, it becomes unnecessary to strictly consider the water tightness of a structure of a wiper motor peripheral member. Further, if used for an electric motor of a power window, even if the casing is submerged in water, the motor can be operated by a switch (a closed window can be opened).

A thirteenth aspect of the invention is a method for manufacturing a gas-permeable plug including a plug body by injection molding, which uses an injection mold including an openable fixed mold and movable mold, and a cavity, in a state where both the molds are closed, for molding a substantially ring-shaped or cylindrical plug body having a vent hole formed through a center portion in an inward-outward direction. The method is characterized by comprising a step of setting a permeable sheet including countless minute permeable pores directed in irregular directions and/or countless fine permeable gaps directed in irregular directions at a molding position of the vent hole of the plug body in one of the fixed mold and the movable mold in a state where the mold is opened, a step of closing both the molds, and sandwiching and fixing a center portion of the permeable sheet between molding surfaces of the respective molds while an outer peripheral portion of the permeable sheet is exposed in the cavity, and a step of molding the plug body by injecting a heat-melted liquid resin to fill the cavity under a predetermined pressure and mechanically bonding the exposed portion of the permeable sheet and the resin integrally by an anchor operation produced by making part of the molten resin enter the minute permeable pores and/or the permeable gaps in irregular directions by the pressure at the exposed portion of the permeable sheet and solidifying the resin.

According to the thirteenth aspect of the invention, at the same time as the molding of the plug body, the permeable sheet is integrally bonded to the sheet bonding portion. The contact structure becomes a strong and uniform fixing structure by the anchor operation since the pressure of the liquid resin during the injection molding is transmitted to the exposed portion of the permeable sheet, and is uniformly exerted on the whole of the exposed portion of the permeable sheet. Therefore, the resin enters the minute permeable pores and/or the permeable gaps in irregular directions.

A fourteenth aspect of the invention is characterized in that in the thirteenth aspect of the invention, when both of the molds are closed, injection molding is carried out in a state where at least an annular portion of an inside of the exposed portion of the permeable sheet is compressed by a projection projecting from the molding surface of one of the molds to the molding surface of the other mold.

According to the fourteenth aspect of the invention, in addition to the operation and effect of the thirteenth aspect of the invention, since the minute permeable pores and/or the permeable gaps of the compressed portion of the permeable sheet are crushed by compression and are smaller than the un-crushed or natural state of the permeable sheet, the resistance against permeation of liquid (molten liquid resin) in this portion becomes high. As a result, there does not occur such a state that the molten liquid resin passes between the tip surface of the projection and the permeable sheet to leak out to the center portion, and a flash is formed at the center portion. Thus, in the case where a product (gas-permeable plug) is completed, since a substantial permeation area of the vent hole is not decreased, the permeable performance is not lowered.

A fifteenth aspect of the invention is characterized in that in the fourteenth aspect of the invention, the permeable sheet is annularly compressed by an annular press portion of a tip of the projection, and injection molding is carried out in a non-compression state at an inside portion relative to the annular press portion.

According to the fifteenth aspect of the invention, in addition to the operation and effect of the fourteenth aspect of the invention, at the time of the injection molding, the center portion of the permeable sheet as the portion having the permeation operation is not compressed, and the original state is held, so that the permeable performance of this portion is not varied and changed.

A sixteenth aspect of the invention is characterized in that in any one of thirteenth to fifteenth aspects of the invention, the exposed portion of the permeable sheet is heated by heat of the ejected resin of a heat molten state, is made softer than that at a room temperature, and is compressed by a pressure of the resin.

According to the sixteenth aspect of the invention, in addition to the operation and effect of any one of the thirteenth to fifteenth aspects of the invention, by the compression of the exposed portion of the permeable sheet, the minute permeable pores and/or the permeable gaps of the exposed portion are crushed by the compression and are small, so that the permeation resistance against gas and liquid is raised. Further, the resin enters the minute permeable pores and/or the permeable gaps, so that the seal property in both directions of the surface direction and the thickness direction is raised in the bonding portion of the permeable sheet, and the gas-permeable plug can be made such that permeation of water from the outside into the inside can be effectively prevented by this bonding portion.

DETAILED DESCRIPTION OF EMBODIMENTS

Figure 1:
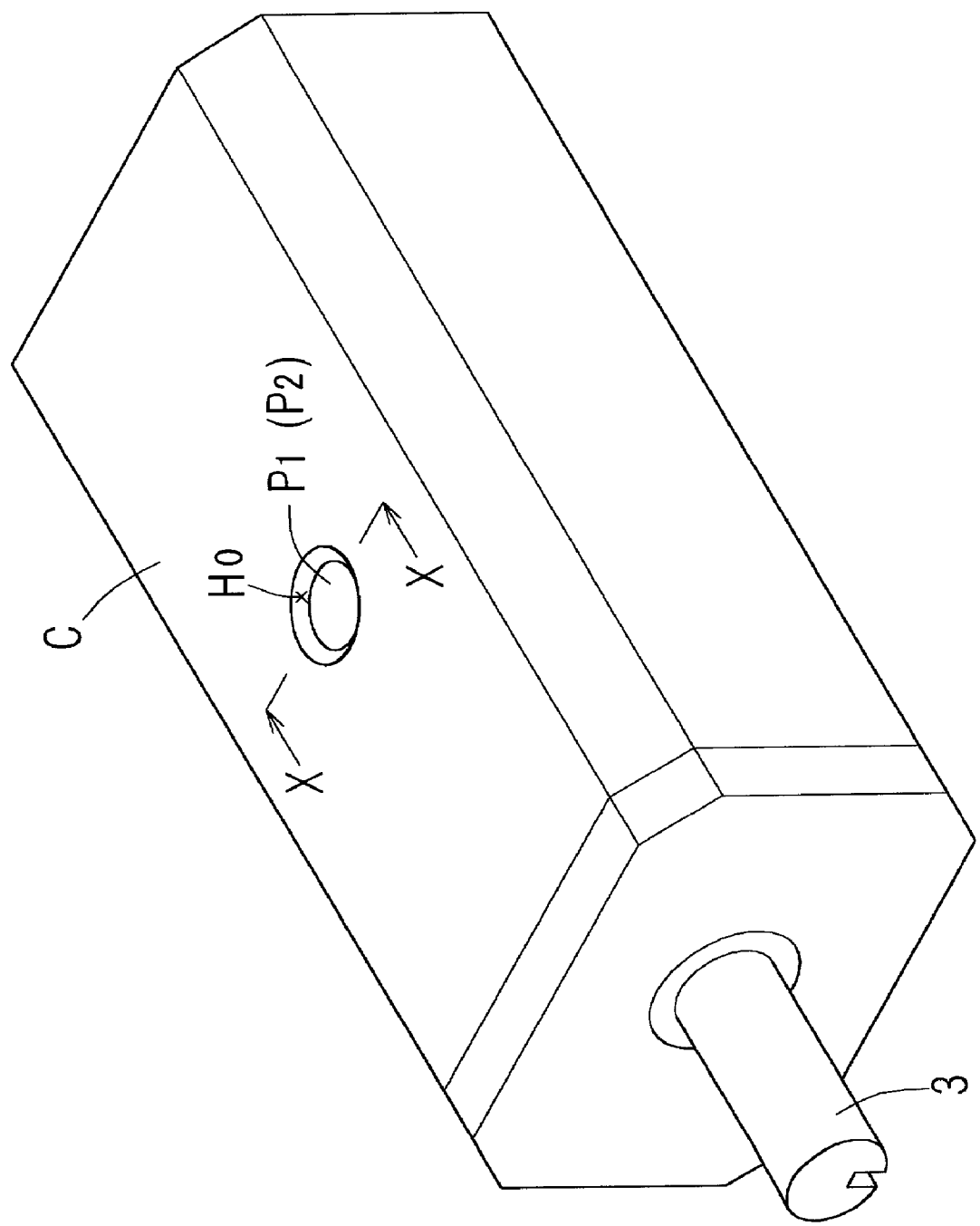
FIG. 1 is a perspective view of a state where a vehicle electric motor is housed in a casing C in which a gas-permeable plug $P_1$ of a first embodiment of the invention is inserted.
Figure 2:
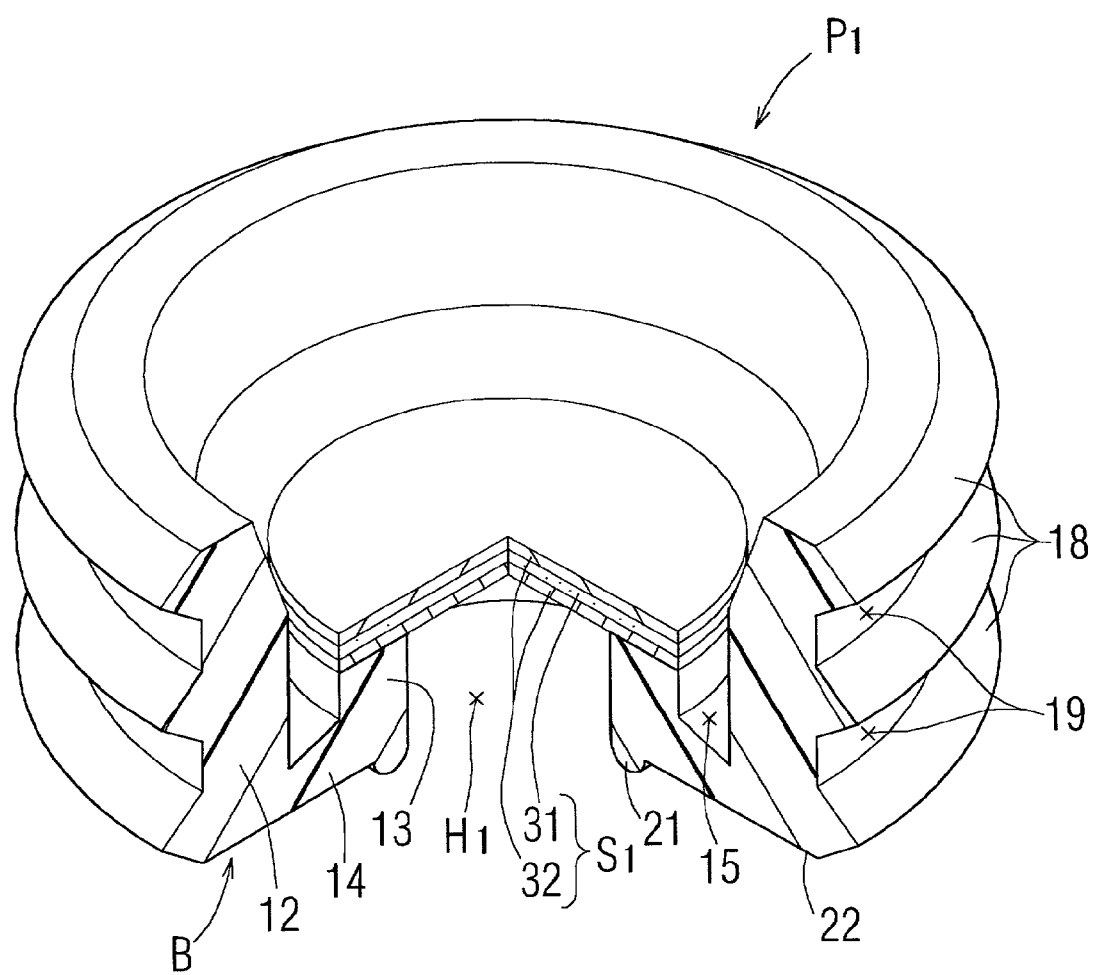
FIG. 2 is a perspective view in which a part of the gas-permeable plug $P_1$ of the first embodiment of the invention is cut away.
Figure 3:
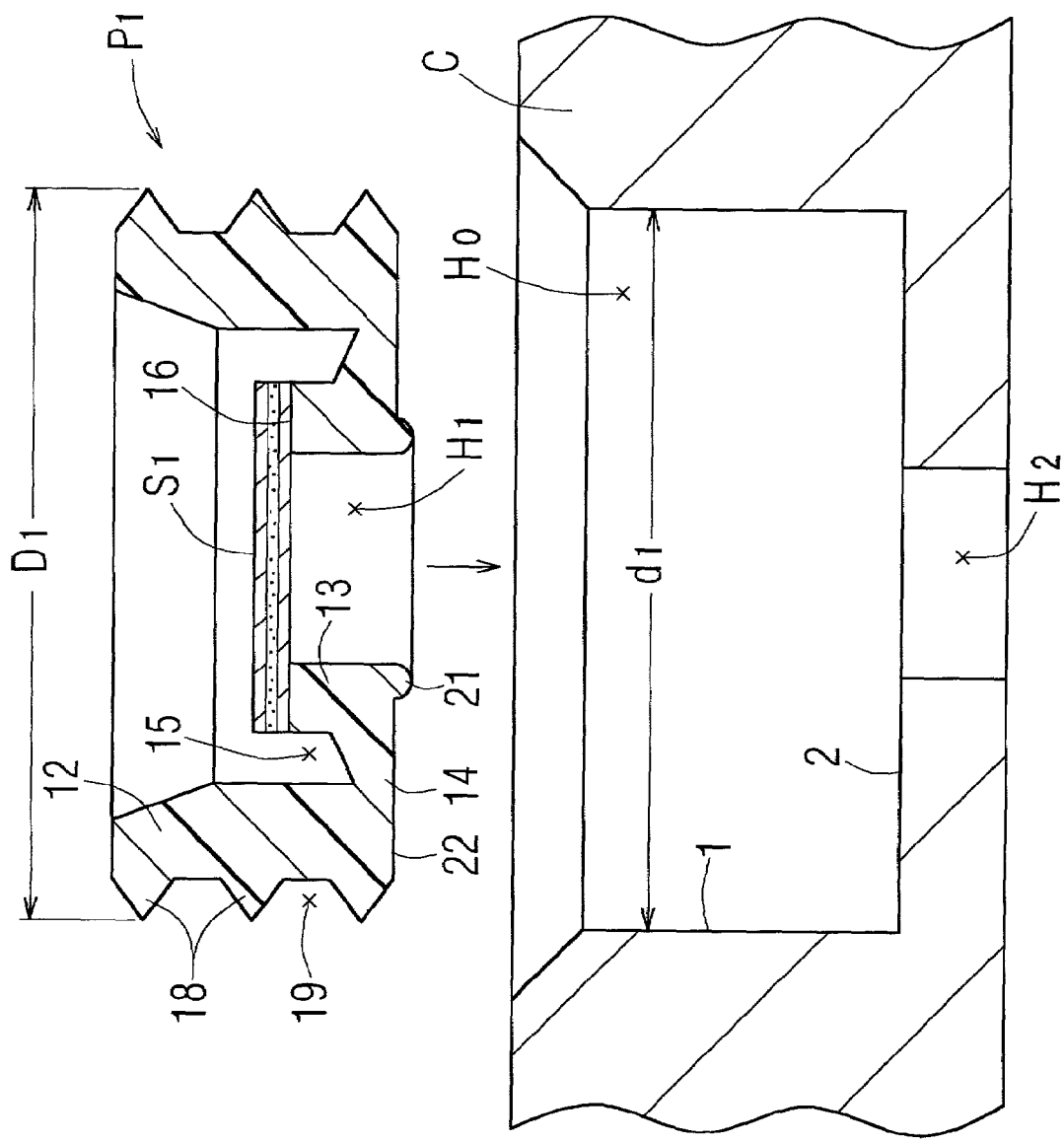
FIG. 3 is a sectional view showing a state before the gas-permeable plug $P_1$ is inserted into an insertion hole $H_0$ of the casing C.
Figure 4:
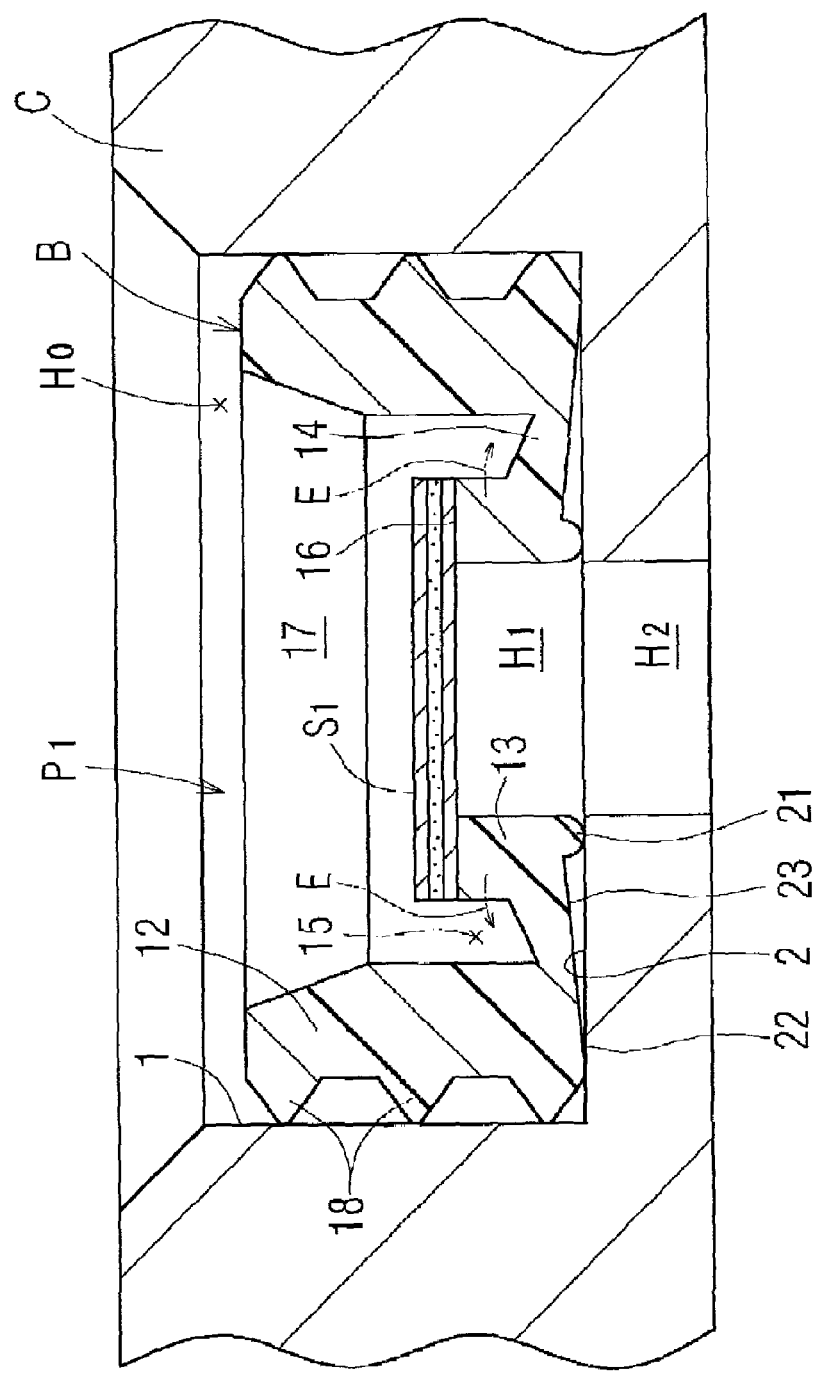
FIG. 4 is a sectional view (enlarged sectional view along line X-X of FIG. 1) after the insertion.

Hereinafter, the present invention will be described in more detail in relation to the embodiments. FIG. 1 is a perspective view of a state where a vehicle electric motor (not shown) is housed in a motor casing (hereinafter simply referred to as "casing") C in which a gas-permeable plug $P_1$ of a first embodiment of the invention is inserted. FIG. 2 is a perspective view in which a part of the gas-permeable plug $P_1$ of the first embodiment of the invention is cut away, FIG. 3 is a sectional view showing a state before the gas-permeable plug $P_1$ is inserted in an insertion hole $H_0$ of the casing C. FIG. 4 is a sectional view (enlarged sectional view along line X-X of FIG. 1) after the insertion. Incidentally, in FIGS. 2, 3, 4 or the like, with respect to the illustration of a "permeable sheet", since illustration of the actual size of the permeable sheet is impossible, the thickness is considerably enlarged in the illustration. As shown in FIGS. 1 to 4, in the casing C in which an electric motor (not shown) is housed, a circular insertion hole $H_0$ is provided partially through the thickness of the casing C, and a casing vent hole $H_2$ is formed concentrically with the insertion hole $H_0$ through the remaining thickness of the casing C. The gas-permeable plug $P_1$ is inserted into the insertion hole $H_0$, and the outermost peripheral portion and the bottom portion of the gas-permeable plug $P_1$ are in elastic contact with an inner peripheral surface 1 and a bottom surface 2 of the insertion hole $H_0$, respectively. Incidentally, in FIG. 1, reference numeral 3 designates a driving shaft of the electric motor protruding from a side surface of the casing C.

As shown in FIGS. 2 to 4, the gas-permeable plug $P_1$ is constituted by a double cylindrical (double ring shape) plug body B of injection molded synthetic resin, and a permeable sheet $S_1$ for closing a portion of a vent hole $H_1$ of the plug body B. The plug body B is constructed such that a cylindrical (ring-shaped) sheet bonding portion 13 is disposed inside, in a radial direction, and a cylindrical (ring-shaped) body portion 12 comes into elastic contact with the inner peripheral surface 1 of the insertion hole $H_0$ of the casing C. Both of the portions 12 and 13 are integrally coupled with an annular thin coupling portion 14 at a bottom surface side, and an annular groove 15 is formed between the portions 12 and 13. An outward end surface of the sheet bonding portion 13 disposed inside the body portion 12 is a sheet bonding surface 16 (see FIG. 4), and the sheet bonding surface 16 is positioned at a place slightly closer to the bottom than a center portion, in the height direction, of the body portion 12 in an inner space 17 of the plug body B. A cylindrical (ring-shaped) hole in the sheet bonding portion 13 constitutes the vent hole $H_1$ of the plug body B.

On the outer peripheral surface of the body portion 12 of the plug body B, a plurality of annular elastic contact portions 18 come into elastic contact with the inner peripheral surface 1 of the insertion hole $H_0$ of the casing C over the whole periphery and are protrusively provided at the outside in the radial direction at predetermined intervals in the axial direction. An outer peripheral recess 19 is formed between the respective adjacent annular elastic contact portions 18. An annular projection 21 is integrally provided on the bottom surface of the plug body B and at a portion adjacent to the vent hole $H_1$, and in the state where the plug body B is inserted in the insertion hole $H_0$ of the casing C, a bottom surface 23 of the plug body B comes into contact with the bottom surface 2 of the insertion hole $H_0$ of the casing C at two places, the annular projection 21 at the inner peripheral side and an annular bonding portion 22 at the outer peripheral side. The sheet bonding portion 13 of the plug body B is elastically deformed somewhat outward. As stated above, since the annular elastic contact portions 18 come in elastic contact with the whole periphery of the inner peripheral surface 1 of the insertion hole $H_0$, water or the like does not infiltrate into the inside of the casing C from a space between the annular elastic contact portions 18 and the inner peripheral surface 1. Incidentally, the inner peripheral surface of the insertion hole $H_0$ at the opening side is formed as a tapered surface shape widening toward the opening side (outward) so that insertion or penetration of the plug body B is easy.

Figure 5:
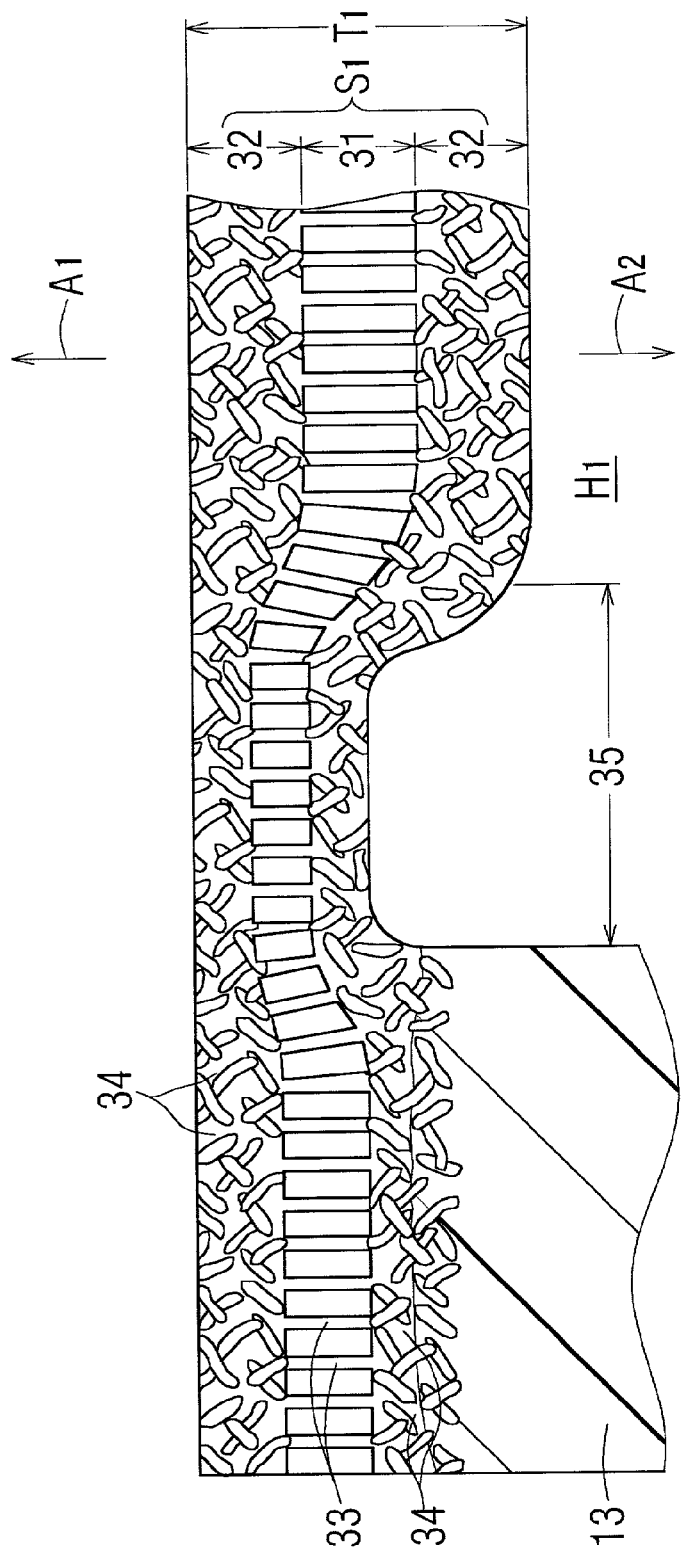
FIG. 5 is a schematic sectional view of a bonding state of a permeable sheet $S_1$ to a sheet bonding portion 13 of a plug body B.

The permeable sheet $S_1$ has a thin disk shape, and structurally, as shown in FIG. 5, can have backing sheets 32 laminated on both surfaces of a permeable sheet body 31, or can have the backing sheet 32 laminated on only one surface of the permeable sheet body 31. Further, the permeable sheets, may only be the permeable sheet body 31. As the permeable sheet body 31, typically, GORE-TEX™, of W.L. Gore & Associates Inc. of US, MICROTEX™, of Nitto Denko Corporation, or the like, are suitably used. The material of any of the permeable sheet bodies 31 is polytetrafluoroethylene resin, or polyolefin resin having a thickness of 50 μm to 200 μm can be obtained according to an objective of use, and these can be suitably selected and used.

The permeable sheet body 31 is almost spongy when viewed microscopically, includes countless minute permeable pores 33 having a size of about 0.05 μm to 20 μm and being directed in irregular directions, and has such performance that although moisture or water vapor having a size of 0.0004 μm in the air, and atmospheric gas (nitrogen gas, oxygen gas) smaller than this are allowed to pass through, a liquid such as a water droplet having a size of 100 μm (approximately corresponding to a size of a drizzle) or an oil droplet, and a solid foreign substance having a size exceeding 20 μm, such as dust, are prevented from passing through.

As a material of the backing sheet 32 laminated on the permeable sheet body 31, a fabric or an unwoven fabric made of fibers of resin of polyamide, polyester, and polyolefin does not corrode and does not dissolve or deteriorate even when it comes in contact with water, and accordingly, the fabric of these materials is suitable. With respect to thickness, although a laminate including the permeable sheet body 31 and having a thickness of 0.05 mm to 0.5 mm can be used, a thickness of about 0.1 mm to 0.3 mm is suitable in view of handling at the time of injection molding. The inside of the backing sheet 32 also includes countless permeable gaps 34 directed in irregular directions.

On the other hand, since it is necessary for resin material for injection molding of the plug body B to be slightly compression deformed in the state where it is inserted in the insertion hole $H_0$ of the casing C, olefin type or styrene type thermoplastic elastomer resin presenting rubber-like elasticity is suitable. Thus, as shown in FIG. 3, an outer diameter ($D_1$) of the plug body B is slightly larger than an inner diameter ($d_1$) of the insertion hole $H_0$ of the casing C. Regarding the hardness of this material, a range of a durometer hardness (A scale) HAD, which is defined in JIS.K7215, of 40 degrees to 75 degrees is desirable.

The permeable sheet $S_1$ is bonded to the sheet bonding surface 16 of the inner end surface of the sheet bonding portion 13 of the plug body B by mechanical fixing due to an anchor operation, and FIG. 5 is a schematic view of the bonding state. Incidentally, in FIG. 5, the minute permeable pores 33 formed in the permeable sheet body 31 are linearly shown only in the thickness direction of the permeable sheet $S_1$ so as to distinguish them from the backing sheet 32 and to enable the illustration. However, the minute permeable pores 33 do not actually have a directional property and are formed in irregular directions. The countless minute permeable pores 33 of irregular shapes having a size of about 0.05 μm to 20 μm are formed in the permeable sheet body 31, and a number of permeable gaps 34 larger than the minute permeable pores 33 of the permeable sheet body 31 are formed in irregular directions in the backing sheets 32 laminated on both surfaces of the permeable sheet body 31. The sheets have a permeable structure and are molded of the above material.

As shown in the schematic view of FIG. 5, at the time of injection molding the plug body B, part of resin forming the sheet bonding portion 13 of the plug body B enters the permeable gaps 34 of at least the backing sheet 32 laminated at the side of the permeable sheet body 31 bonded to the sheet bonding surface 16 of the plug body B, and preferably, at least partially into the minute permeable pores 33 of the permeable sheet body 31, preferably over the whole thickness, as well. With respect to the infiltration of the resin, when the plug body B is molded by an injection molding method described later, a heat-melted liquid resin is filled in a cavity 61 of a mold F for molding the plug body B, and is forcibly pressed into the permeable gaps 34 by the action of the resin injection pressure and dwelling pressure of several hundred to several thousand Newton per $cm^2$. At an annular bonding portion between the plug body B and the permeable sheet $S_1$, by the anchor operation due to the entrance and solidification of the resin in the permeable gaps 34 of almost the entire region by the above operation, the permeable sheet $S_1$ is firmly bonded (fixed) to the annular sheet bonding portion 13 formed on the outer peripheral portion of the vent hole $H_1$ of the plug body B.

At the portion corresponding to the bonding portion of the permeable sheet $S_1$, and at the time of injection molding, the permeable sheet body 31 and the respective backing sheets 32 laminated on both surfaces of the permeable sheet body 31 receive the injection pressure and dwelling pressure of the resin, and are compressed in the thickness direction, so that the thickness is somewhat decreased from the original thickness ($T_1$). Further, the permeable gaps 34 and the minute permeable pores 33 in the inside are crushed, and their size is smaller than in their natural state (state when the injection pressure and dwelling pressure are not applied). This means that as compared with other portions (portions not crushed), in the permeable sheet body 31 and the backing sheet 32 of the portion corresponding to the bonding portion, gas such as the air or moisture in the air meets large resistance when passing through in any directions. In other words, the permeability is lowered, and conversely speaking, the seal property is higher, that is, the permeation resistance becomes high.

By this, at the bonding portion, the resin enters the permeable gaps 34 of the backing sheet 32 as the inside of the casing C, and the permeable sheet $S_1$ is firmly fixed to the sheet bonding portion 13 at the outer peripheral side of the vent hole $H_1$. Further, the portion is compressed in addition to the infiltration of the resin, so that the permeability of the portion is lowered (the permeation resistivity is raised), as compared with the other portions. Accordingly, at the portion corresponding to the bonding portion, even in the case where the resin does not enter all the gaps 34 in the thickness direction of the backing sheet 32, that is, even in the case where the permeable gaps 34 remain in which the resin does not bite, this portion does not allow a water droplet or the like to pass through, and the seal property at the bonding portion is higher than at the other portion.

In the backing sheet 32, an annular compression portion 35 (see FIG. 5) of an inner periphery of the bonding portion 13 is more compressed in the thickness direction by the action of an annular pressing portion 54 of the mold F described later than the bonding portion, and the minute permeable pores 33 and the permeable gaps 34 are crushed and become smaller than in the natural state, and as compared with the center portion (portion closing the vent hole $H_1$ of the plug body B) which is in the natural state, the permeability is lowered, and consequently, the seal property becomes high.

Figure 6:
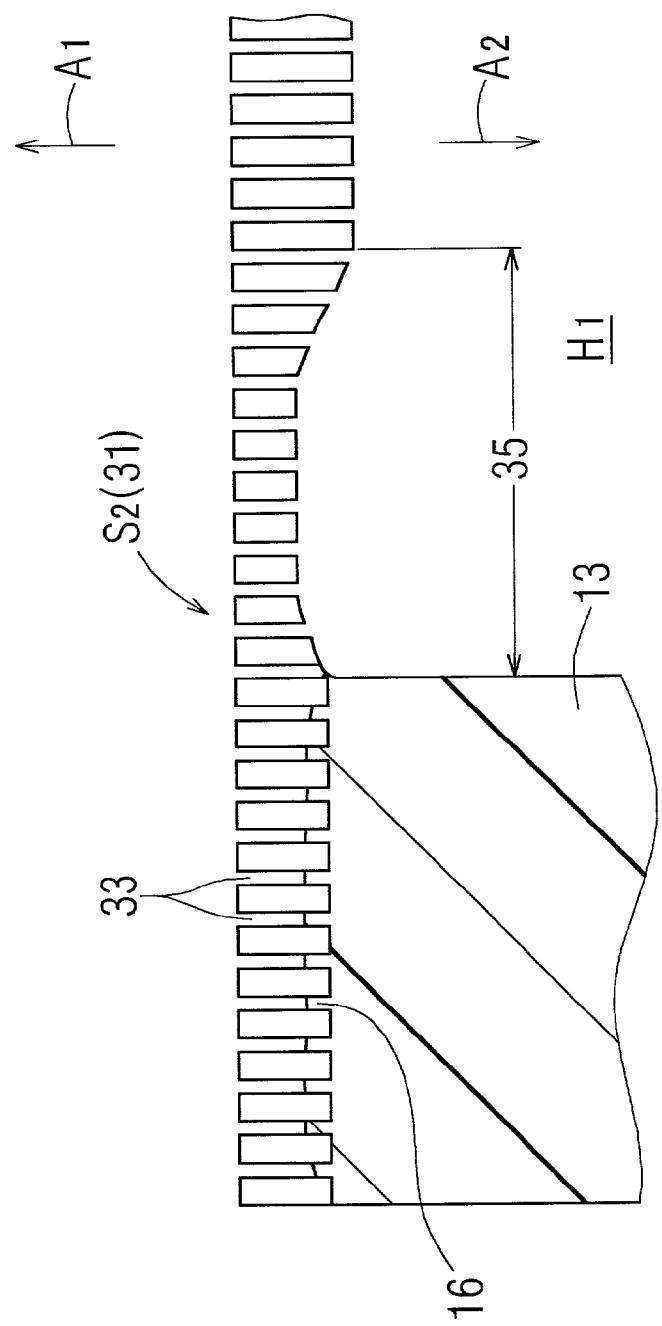
FIG. 6 is a schematic sectional view of a bonding state of a permeable sheet $S_2$ to the sheet bonding portion 13.

FIG. 6 is a schematic view of a bonding (fixing) state between the sheet bonding portion 13 and a permeable sheet $S_2$ in a case where the permeable sheet body 31 is singly used. Incidentally, the shapes of the minute permeable pores 33 are similar to those explained in FIG. 5. In the permeable sheet $S_2$, in the case where the thin disk-shaped permeable sheet body 31 is singly used, at the time of injection molding of the plug body B, the permeable sheet body 31 is compressed by the injection pressure and dwelling pressure (a combination of both is referred to as injection molding pressure), and both become integral and are firmly fixed in a state where a part of heat-melted liquid resin enters the minute permeable pores 33 of the permeable sheet body 31. Thus, the bonding force (fixing force) of the permeable sheet $S_2$ (permeable sheet body 31) to the sheet bonding portion 13 of the plug body B is raised, and the seal property at the bonding portion is also improved. As stated above, in the case where the permeable sheet body 31 is singly used as the permeable sheet $S_2$, since the permeability is not changed in a portion other than the portion (bonding portion) where the resin enters the minute permeable pores 33 to raise the seal property, and other than the annular compression portion 35, the gas-permeable plug $P_1$ having the permeable performance as previously designed can be made without changing the permeable performance of the permeable sheet body 31 with respect to gas. In any of the examples, in a case where a water droplet or an oil droplet is apt to adhere, it is more suitable to previously carry out a water repellent or oil repellent treatment on the surface of the permeable sheet body 31 and/or the backing sheet 32. Incidentally, in FIGS. 5 and 6, arrows $A_1$ and $A_2$ respectively designate vent directions of the portion of the vent hole $H_1$ of the plug body B. $A_1$ designates the vent direction from the inside of the casing C to the outside, and $A_2$ designates the vent direction from the outside of the casing C to the inside.

Figure 7:
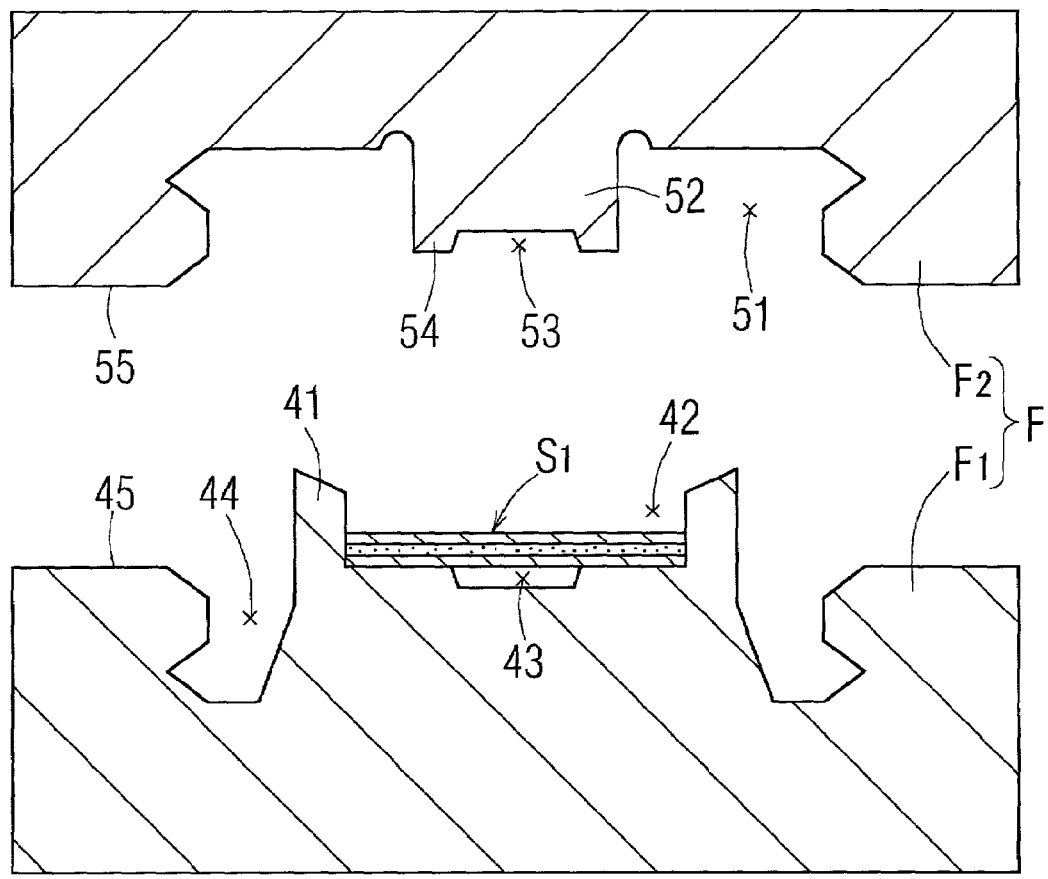
FIG. 7 is a sectional view of a state where a mold F for molding the gas-permeable plug $P_1$ is opened.
Figure 8:
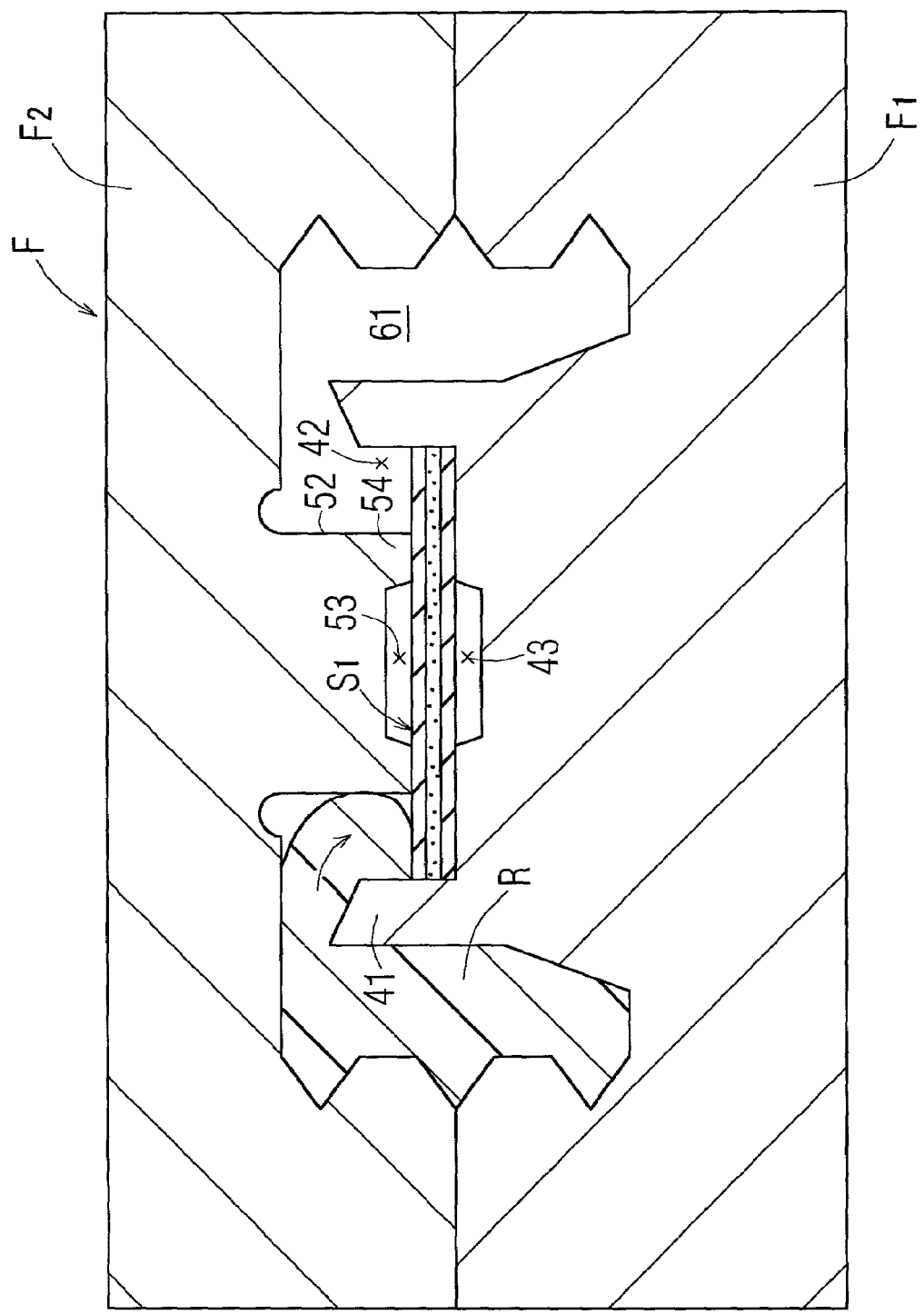
FIG. 8 is a sectional view of a state where injection molding is carried out in a closed state.
Figure 9:
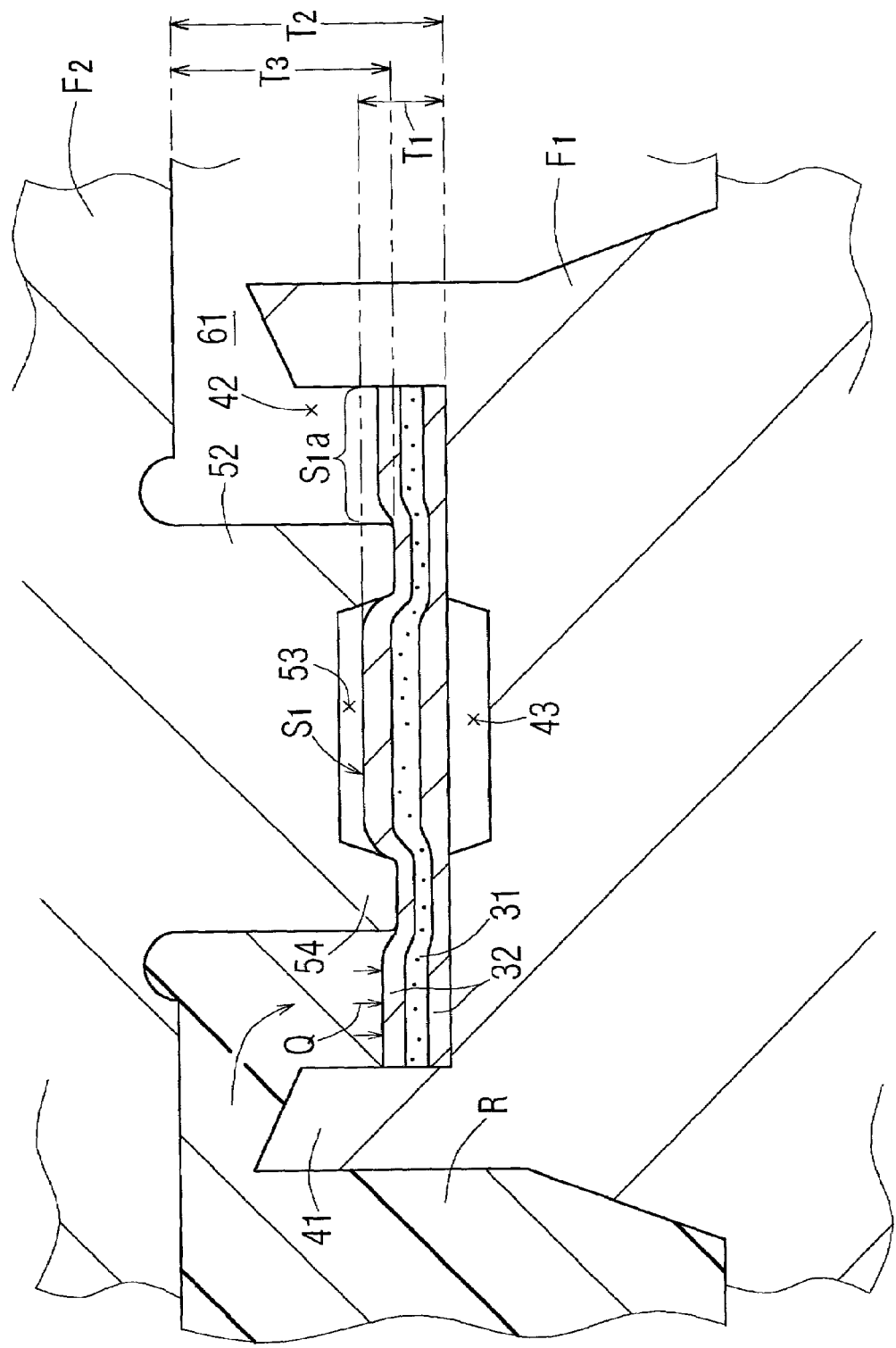
FIG. 9 is an enlarged view of a part of a permeable sheet $S_1$ of FIG. 8.

Subsequently, an injection molding method of the gas-permeable plug $P_1$ will be described using the injection mold F. FIG. 7 is a sectional view of a state where the mold F is opened, FIG. 8 is a sectional view of a state where it is closed, and FIG. 9 is an enlarged view of a main portion (portion of the permeable sheet $S_1$) of FIG. 8. First, the mold F will be described, and then, the method of injection molding the gas-permeable plug $P_1$ using this mold F will be described.

The mold F is constituted by a fixed mold $F_1$ fixedly disposed and for forming a surface side of the gas-permeable plug $P_1$ (when a state where it is attached to the casing C is made as a standard, a surface directed toward the outside of the casing C), and a movable mold $F_2$ opened and closed with respect to the fixed mold $F_1$ and for forming a rear side of the gas-permeable plug $P_1$ (when the state where it is attached to the casing C is made the standard, a surface directed to the inside of the casing C), and both of the molds $F_1$ and $F_2$ are made of steel. At the center of the fixed mold $F_1$, an annular projection 41 for molding the annular groove 15 of the gas-permeable plug $P_1$ as a molded product is formed, and a circular portion surrounded by the annular projection 41 is a first recess 42. The inner diameter of the first recess 42 is slightly larger than the outer diameter of the permeable sheet $S_1$ so that the permeable sheet $S_1$ can be set on the bottom surface. At the center portion of the first recess 42, a second recess 43 is formed concentrically with the first recess 42 so that a portion performing a vent function at the center portion of the permeable sheet $S_1$ set on the bottom does not come into contact with the bottom surface of the first recess 42. A cavity portion 44 for molding an almost half portion of the surface side of the body portion 12 of the plug body B is formed to be annular at the outside of the annular projection 41 of the fixed mold $F_1$. Incidentally, in FIG. 7, reference numeral 45 designates a contact surface (parting surface) of the fixed mold $F_1$.

Further, a circular groove cavity portion 51 for molding all remaining portions except for the almost half portion of the surface side of the plug body B is formed in the movable mold $F_2$ for molding the rear surface side of the gas-permeable plug $P_1$. A columnar projection 52 for molding the vent hole $H_1$ of the gas-permeable plug $P_1$ is formed to project from the bottom surface of the cavity portion 51. A recess 53 opposite to the second recess 43 of the fixed mold $F_1$ is formed on the tip surface of the columnar projection 52, and an annular press portion 54 is formed at its peripheral portion. Incidentally, in FIG. 7, reference numeral 55 denotes a contact surface (parting surface) of the movable mold $F_2$.

Then, the injection molding of the gas-permeable plug $P_1$ using the mold F is carried out in a manner as described below. First, as shown in FIG. 7, the permeable sheet $S_1$ is set on the first recess 42 of the fixed mold $F_1$. Since the inner diameter of the first recess 42 is slightly larger than the outer diameter of the permeable sheet $S_1$, in the set state, the permeable sheet $S_1$ can be set without deformation of its outer peripheral portion. Further, very little gap is provided between the outer periphery of the permeable sheet $S_1$ and the inner periphery of the annular projection 41 of the fixed mold $F_1$. The permeable sheet $S_1$ has such a structure that the backing sheets 32 are laminated on both surfaces of the permeable sheet body 31. Further, since the permeable sheet $S_1$ is disk-shaped, there are no restrictions regarding the front, back or directionality in the set state, and the setting operation becomes easy. Further, as described later, the backing sheet 32 also functions as a heat insulating layer to prevent the permeable sheet body 31 from coming in direct contact with the surface of the mold.

After the permeable sheet $S_1$ is set, when the movable mold $F_2$ is made to approach the fixed mold $F_1$, and the respective contact surfaces 45 and 55 of both the molds $F_1$ and $F_2$ contact each other to close the mold F, as shown in FIGS. 8 and 9, the center portion of the permeable sheet $S_1$ is sandwiched and fixed between the annular press portion 54 provided at the tip of the columnar projection 52 of the movable mold $F_2$ and the bottom surface of the first recess 42 of the fixed mold $F_1$. Also, a space formed in a state where the cavities 44 and 51 of the fixed mold $F_1$ and the movable mold $F_2$ are combined, forms a cavity (molding space) 61. Since the outer shape of the columnar projection 52 of the movable mold $F_2$ is smaller than the outer shape of the permeable sheet $S_1$, in the state where the permeable sheet $S_1$ is set and the molds are closed, a portion of the outer periphery of the permeable sheet $S_1$ exposed to the outside of the columnar projection 52 becomes annular and is exposed in the cavity 61. This exposed portion $S_{1a}$ (see FIG. 9) is integrally bonded to the sheet bonding portion 13 of the plug body B.

In the case where the center portion of the permeable sheet $S_1$ is sandwiched using the tip of the columnar projection 52 of the movable mold $F_2$, a structure may be adopted such that the recess 53 is not provided, and the permeable sheet $S_1$ is sandwiched using the whole surface of the tip of the columnar projection 52. However, as in the above structure, when the recess 53 is formed in the tip surface of the columnar projection 52 and the annular press portion 54 is formed at the peripheral edge portion, a circular portion (portion closing the vent hole $H_1$ of the plug body B) of the inside of the annular press portion 54 in the permeable sheet $S_1$ does not come into contact with the movable mold $F_2$ and is not compressed, so that the natural state of the permeable sheet $S_1$ is maintained. As a result, the vent function of the circular portion in the permeable sheet $S_1$ is not changed, and the original vent function can be performed. Further, since the permeable sheet $S_1$ is annularly sandwiched using the annular press portion 54 of the movable mold $F_2$ and is compressed, contact between the permeable sheets $S_1$ and the annular press portion 54 is certain, and the seal property between both is raised by this pressed portion of the permeable sheets $S_1$, which prevents molten resin from entering the inside portion (portion of the recess 53) of the annular press portion 54 on the permeable sheet $S_1$.

At the time of injection molding of the plug body B, the permeable sheet body 31 of the permeable sheet $S_1$ set in the mold F is heated by conductive heat, radiant heat or the like from the mold F, and there is a case where heat deformation or performance deterioration due to the heat occurs. However, as in the foregoing structure, in the movable mold $F_2$, when the recess 53 is formed at the portion coming into contact with the surface of the center portion of the permeable sheet $S_1$, a non-contact portion with the movable mold $F_2$ is formed. Thus, in this portion, the danger of heat deformation or heat deterioration occurring can be decreased, and the permeable performance of the permeable sheet body 31 is not changed.

For completely the same reason, although the first recess 42 of the fixed mold $F_1$ may be flat, it is desirable to form the second recess 43 at the center portion. By this structure, both the front and back surfaces of the center portion of the permeable sheet $S_1$ do not come into contact with the mold F and are not compressed, and the danger of heat deformation or heat deterioration occurring can be further decreased.

Further, as shown in FIG. 9, at the portion where the permeable sheet $S_1$ is sandwiched between both the molds $F_1$ and $F_2$, the permeable sheet $S_1$ having a thickness $T_1$ in the natural state (state where compression and deformation are not performed) is used. In the state where both the molds $F_1$ and $F_2$ are closed, in the case where a distance between the bottom of the first recess 42 of the fixed mold $F_1$ and the bottom of the cavity 51 of the movable mold $F_2$ is $T_2$, and the height (projection length) of the columnar projection 52 of the movable mold $F_2$ is $T_3$, it is preferable to adopt such a structure that the relation of $T_3 > (T_2 - T_1)$ is set, and the permeable sheet $S_1$ is somewhat compressed in the thickness direction between the annular press portion 54 of the movable mold $F_2$ and the bottom of the first recess 42 of the fixed mold $F_1$. With respect to the compression amount of this permeable sheet $S_1$, such compression as to cut the permeable sheet $S_1$ at the time of mold clamping should be avoided, and a preferable compression amount is such that it is made to be substantially proportional to the ratio of space occupied by the minute permeable pores 33 and the permeable gaps 34 in the thickness direction of the permeable sheet $S_1$, and in the case where the thickness in the natural state is made 100, the thickness after the compression falls within the range of 90 to 5.

By this, in the permeable sheet $S_1$, the minute permeable pores 33 and/or the permeable gaps 34 are crushed at the compression portion, and the height of the compression portion is decreased, so that the ratio of open space becomes small, and the permeable sheet $S_1$ becomes locally dense. Thus, the permeation resistance against fluid, that is, the seal property becomes high, and in the case where a molten resin is filled in the cavity 61, it is possible to satisfactorily prevent the molten resin from exceeding the tip of the columnar projection 52 and flowing into the inside of the columnar projection 52. Therefore, the flow of the molten resin into the portion (portion to close the vent hole $H_1$ of the plug body B) to perform a permeation function in the permeable sheet $S_1$ is prevented, and the effective area to perform the permeation function of the permeable sheet $S_1$ is not decreased. As a result, excellent permeable performance is maintained.

Next, the sequence of injection molding will be described. Regarding the molding conditions, olefin thermoplastic elastomer resin is used as the material resin of the plug body B, non-woven fabric of olefin resin fiber is used as the material resin of the backing sheet 32 constituting the permeable sheet $S_1$, a resin temperature at the injection molding is 240° C., and a temperature of the mold F is 60 to 80° C. First, a high temperature liquid molten resin R injected from an external injection nozzle (not shown) of an injection molding machine (not shown) through an injection gate (not shown) into the cavity 61 flows toward the right side in FIG. 9 while successively filling the left side of the cavity 61. Then, the resin further flows toward the right side and when it bumps against the annular projection 41 of the fixed mold $F_1$, the flow direction is changed upward in the drawing and exceeds the tip of the annular projection 41, and the direction is then changed downward and it flows into the first recess 42. Here, although the molten resin R passes through the gap formed between the annular projection 41 and the movable mold $F_2$, at this time, shear force is generated inside the molds $F_1$ and $F_2$ which produces heat, so that solidification of the resin is hard to produce and resin flow is easy to cause. Although the molten resin R flowing into the first recess 42 of the cavity 61 comes in contact with the exposed portion $S_{1a}$ of the permeable sheet $S_1$, since this permeable sheet $S_1$ is made of a resin having a remarkably low heat conductivity as compared with steel constituting the mold F, even if the molten resin R comes in contact with the permeable sheet $S_1$, it does not immediately solidify. At this time, since the molten resin R flowing into the first recess 42 exerts a pressure in the vertical direction on the surface of the permeable sheet $S_1$, the permeable sheet $S_1$ is not turned up.

The molten resin R is successively supplied from the injection molding gate, and in the state where the cavity 61 of the mold F is completely filled with the molten resin R, a pressure holding step starts, and a predetermined pressure (holding pressure) is continued to be applied so that the pressure of the resin filled in the cavity 61 is not lowered.

In this pressure holding state, at the portion where the permeable sheet $S_1$ is in contact with the molten resin R, by the action of the injection molding pressure and/or the holding pressure, part of the molten resin R in contact with the permeable sheet $S_1$ flows into the countless permeable gaps 34 of the backing sheet 32 constituting the rear side of the permeable sheet $S_1$. In this state, in the exposed portion $S_{1a}$ of the permeable sheet $S_1$, the whole of the exposed portion $S_{1a}$ is compressed in the thickness direction by uniform liquid pressure Q of the molten resin R in contact with the exposed portion $S_{1a}$, and is continued to be pressed to the bottom of the first recess 42 of the fixed mold $F_1$ (see FIG. 9). By this action, the molten resin R almost uniformly enters the permeable gaps 34 over the whole of the backing sheet 32 of the exposed portion $S_{1a}$.

Then, since the countless permeable gaps 34 formed in the backing sheet 32 are directed in irregular directions as mentioned above, as shown in FIG. 5, the resin enters the countless permeable gaps 34 in countless irregular directions, and when the resin is solidified in this state, the resin forming the sheet bonding portion 13 of the plug body B and the permeable sheet $S_1$ are firmly connected (fixed) by the anchor effect of the permeable gaps 34 of the backing sheet 32 and the resin. Incidentally, it is preferable that the part of the molten resin R entering the countless permeable gaps 34 of the backing sheet 32 flows through the backing sheet 32 and also enters the minute permeable pores 33 of the permeable sheet body 31. Especially, it is preferable to set the injection dwelling pressure to be high, or to use a resin having a low viscosity in the molten state, since the flowability is high so that the resin can be made to enter the minute permeable pores 33, and the bonding (fixing) becomes even stronger and more certain.

The backing sheet 32 is heated by the molten resin R up to the heat deformation temperature or higher, is somewhat softened and becomes easy to deform. Accordingly, the backing sheet 32 is softened in a state where the whole exposed portion is uniformly pressed against the bottom of the first recess 42 of the first fixed mold $F_1$ and is compressed, so that the thickness becomes somewhat thinner than the natural state before the compression.

The sizes of the permeable gaps 34 become small in the thickness direction of the backing sheet 32 by the infiltration of the molten resin R into the countless permeable gaps 34, or by compression due to resin pressure. Thus, at the bonding portion of the permeable sheet $S_1$ to the sheet bonding portion 13 of the plug body B, together with the infiltration of the molten resin R, as compared with the portion (center portion of the permeable sheet $S_1$) of the natural state, the seal property is improved (permeation becomes hard to effect). Thus, at the bonding portion, in any direction normal to and parallel to the surface of the backing sheet 32, as compared with the portion of the permeable sheet $S_1$ in the natural state, the seal property is improved, and even if a water droplet or the like adheres to the outside of the bonding portion, it does not pass through the permeable sheet $S_1$ and does not enter the inside.

Further, in the case where the permeable sheet $S_1$ pinched by the columnar projection 52 (annular press portion 54) of the movable mold $F_2$ is compressed, the molten resin R does not exceed the tip of the columnar projection 52 (annular press portion 54) to flow into the inside of the compressed portion of the permeable sheet $S_1$. Thus, the liquid molten resin R does not pass between the annular press portion 54 and the permeable sheet $S_1$ to leak into the center portion and to generate a flash. Thus, in the portion of the permeable sheet $S_1$ of the gas-permeable plug $P_1$ as a molded product, since the substantial vent area of the vent hole is not decreased, the permeable performance does not lower. Further, the minute permeable pores 33 and/or the permeable gaps 34 of the compressed portion of the permeable sheet body 31 and the backing sheet 32 constituting the permeable sheet $S_1$ are crushed and the sizes become smaller than in the normal state, and the annular compression portion 35 (see FIG. 6) with the improved seal property is formed. Incidentally, as in this embodiment, when the plug body B and the permeable sheet body 31 and/or the backing sheet 32 are molded of a combination of materials having mutual miscibility, in addition to bonding by the anchor operation, bonding by adhesion or fusion of both can also be obtained, and stronger consistent fixing can be obtained, which is further preferable.

Then, as shown in FIGS. 3 and 4, the gas-permeable plug $P_1$ molded by injection molding is inserted in the insertion hole $H_0$ provided in the casing C of the vehicle electric motor. That is, when the gas-permeable plug $P_1$ is inserted into the insertion hole $H_0$ from the side of the annular projection 21, since the outer diameter $(D_1)$ is slightly larger than the inner diameter $(d_1)$ of the insertion hole $H_0$, the body portion 12 of the outer periphery of the plug body B is slightly compressed and elastically deformed toward the inside in the radial direction, and the respective annular elastic contact portions 18 protruding on the outer peripheral surface come in elastic contact with the inner peripheral surface 1 of the insertion hole $H_0$. In the state where the annular projection 21 provided on the bottom is in contact with the bottom 2 of the insertion hole $H_0$, the gas-permeable plug $P_1$ is inserted in the insertion hole $H_0$ of the casing C. In this state, as shown in FIG. 4, there occurs a state that the vent hole $H_1$ of the gas-permeable plug $P_1$ and the casing vent hole $H_2$ provided in the casing C are coincident with each other. Here, the annular elastic contact portions 18 come in elastic contact with the inner peripheral surface 1 of the insertion hole $H_0$, and both portions are sealed with respect to each other. As a result, a water droplet or dust is prevented from infiltrating into the inside of the vent hole $H_1$.

Here, as set forth above, in the state where the gas-permeable plug $P_1$ is inserted in the insertion hole $H_0$ of the casing C, the body portion 12 of the outer peripheral portion of the plug body B is slightly compressed and elastically deformed toward the inside, and is coupled with the inner peripheral side sheet bonding portion 13 of the body portion 12 through the thin coupling portion 14 at the bottom side of both the portions 12 and 13. Further, the annular groove 15 is formed between both the portions 12 and 13. Thus, the influence of the compression deformation of the body portion 12 is not exerted on the portion of the permeable sheet $S_1$ integrally bonded to the sheet bonding surface 16 as the inner end surface of the sheet bonding portion 13. As a result, the permeable sheet $S_1$ is free from the compression force in the surface direction, wrinkles or broken lines are not formed in the permeable sheet $S_1$, and the permeable sheet $S_1$ is not lowered in durability and can perform the original permeation function.

The body portion 12 of the plug body B is slightly compressed and elastically deformed, as shown by an arrow E in FIG. 4, and the sheet bonding portion 13 of the plug body B is slightly elastically deformed to the outside in the radial direction with the thin coupling portion 14 at the bottom side as the center. Since the annular projection 21 is provided at the adjacent portion of the vent hole $H_1$ at the bottom of the plug body B, the annular projection 21 comes in contact with the bottom surface 2 of the casing C, so that the sheet bonding portion 13 is elastically deformed toward the outside of the casing C, and the sheet bonding portion 13 of the plug body B is further deformed outward in the radial direction. As stated above, since the sheet bonding portion 13 of the plug body B is deformed outward by the above mentioned two factors, the permeable sheet $S_1$ integrally bonded to the sheet bonding surface 16 of the inner end surface is, in all portions in the surface direction, slightly given a tensile force in the radial direction, and the sheet $S_1$ is held in the state where it is slightly stretched outward in the radial direction. By this action, the portion to perform the permeation function at the center portion of the permeable sheet $S_1$ is not compressed in the surface direction, the formation of wrinkles or the like is effectively prevented, and the original function of the permeable sheet is sufficiently performed. Also, in the state where the gas-permeable plug $P_1$ is inserted in the insertion hole $H_0$ of the casing C, the bottom 23 comes in contact with the bottom 2 of the insertion hole $H_0$ at only two places, the inner peripheral side annular projection 21 and the outer peripheral side annular contact portion 22, and the sheet bonding portion 13 of the bottom 23 is somewhat outwardly deformed elastically.

In the use state of the casing C of the vehicle electric motor, when the inner air expands due to heat generated by the electric motor housed inside, the inner pressure becomes higher than the atmospheric pressure, and the expanded air is discharged to the outside through the permeable sheet $S_1$ of the gas-permeable plug $P_1$ inserted in the insertion hole $H_0$ of the casing C, equalizing the inner pressure of the casing C and the external atmospheric pressure. As stated above, a rise of pressure in the casing C is prevented by the action of the permeable sheet $S_1$, and the seal portion or the like of the casing C is not damaged by the pressure rise.

On the contrary, when the electric motor is stopped, heat generated by the motor disappears, and the inner air shrinks as its temperature lowers, and when the pressure in the casing C starts to lower, the external air passes through the permeable sheet $S_1$ of the gas-permeable plug $P_1$ into the inside of the casing C. At this time, even if a water droplet or the like adheres to the permeable sheet $S_1$, since the permeable sheet body 31 constituting the permeable sheet $S_1$ does not allow a liquid of an extremely large size, such as a water droplet, to pass through, although allows the air and moisture (water vapor) in the air to pass through, the water droplet does not infiltrate into the inside of the casing C. As a result, there does not occur such a state that a water droplet adheres to the electric motor housed in the casing C and corrodes it, and erroneous operation of the motor or trouble with the motor is prevented.

Further, even when an accident where a vehicle falls in water occurs, and the motor casing C sinks in the water, the water does not infiltrate into the casing C due the permeable sheet $S_1$ constituting the gas-permeable plug $P_1$, and the electric motor inside the casing C is not short-circuited by the water, but operates normally. Thus, in the case where the electric motor is for a power window and the vehicle sinks in the water, within a predetermined time (for example, five minutes), a closed window can be opened and an escape from the vehicle becomes possible.

Here, the gas-permeable plug made of a material (synthetic resin) having rubber-like elasticity can receive a compression force inward in the radial direction to handle transportation or in insertion work to the insertion hole $H_0$ of an attachment object, such as the motor casing C. In a typical case, the gas-permeable plug is grasped from an outer peripheral side by human hands at the time of the insertion work or by robot hands, and in this case, a compression force is exerted on the plug body inward in the radial direction, it is elastically deformed in the radial direction, and when the deformation exceeds the limit, a force may be exerted on the bonding portion between the plug body B and the permeable sheet $S_1$.

When such a state occurs, peeling of the permeable sheet $S_1$ at the bonding portion or an insufficient portion in the bonding strength may occur, and consequently, a "wrinkle" may be formed on the permeable sheet $S_1$ itself. There may be a fear that an insufficiency in bonding strength or lowering in sheet performance occurs in this "wrinkle" portion. In this case, water infiltrates from the portion of insufficient bonding strength, or the permeable performance (especially, the original function to prevent passing of water droplet) of the sheet itself may be lowered.

Figure 10:
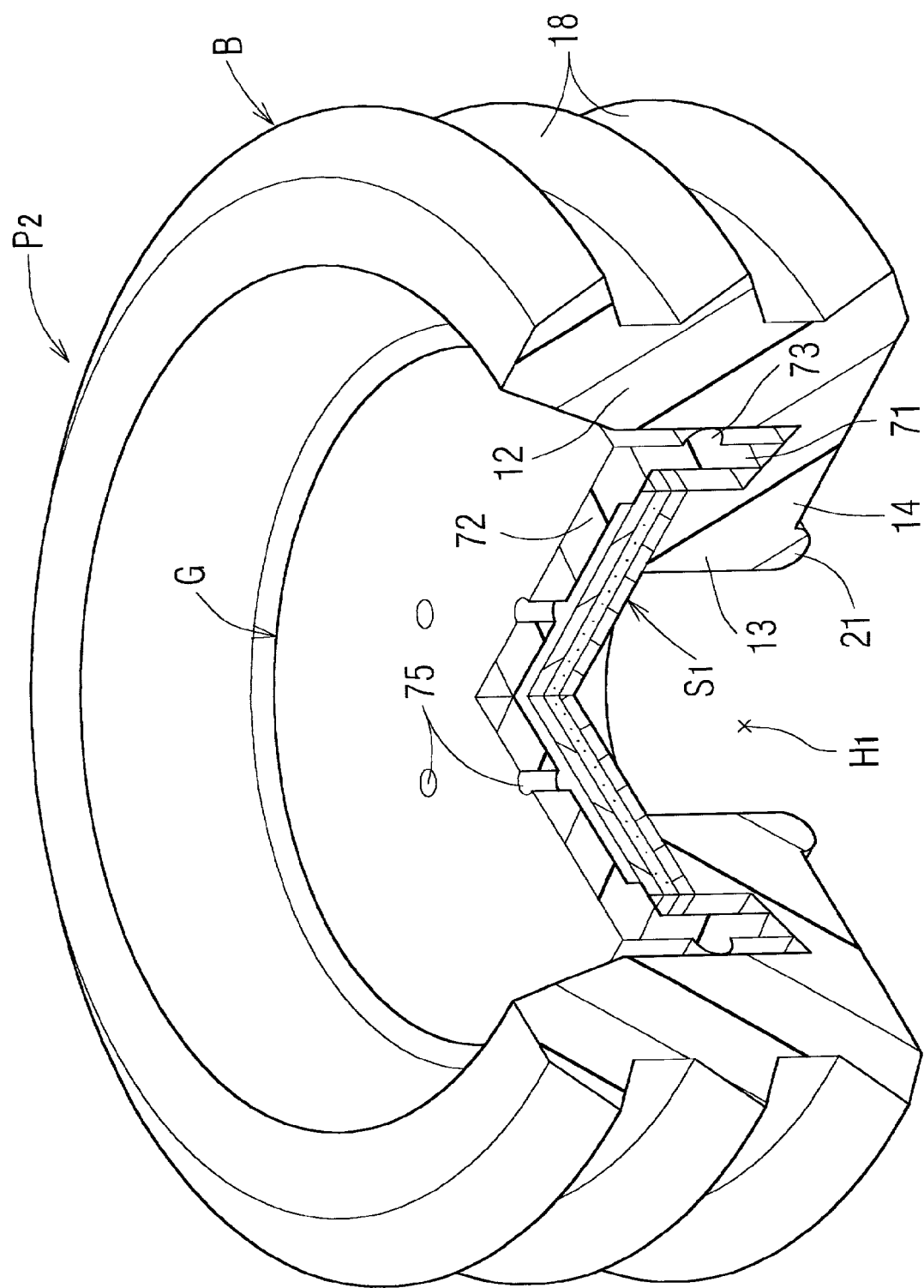
FIG. 10 is a perspective view in which a part of a gas-permeable plug $P_2$ of a second embodiment of the invention is cut away.
Figure 11:
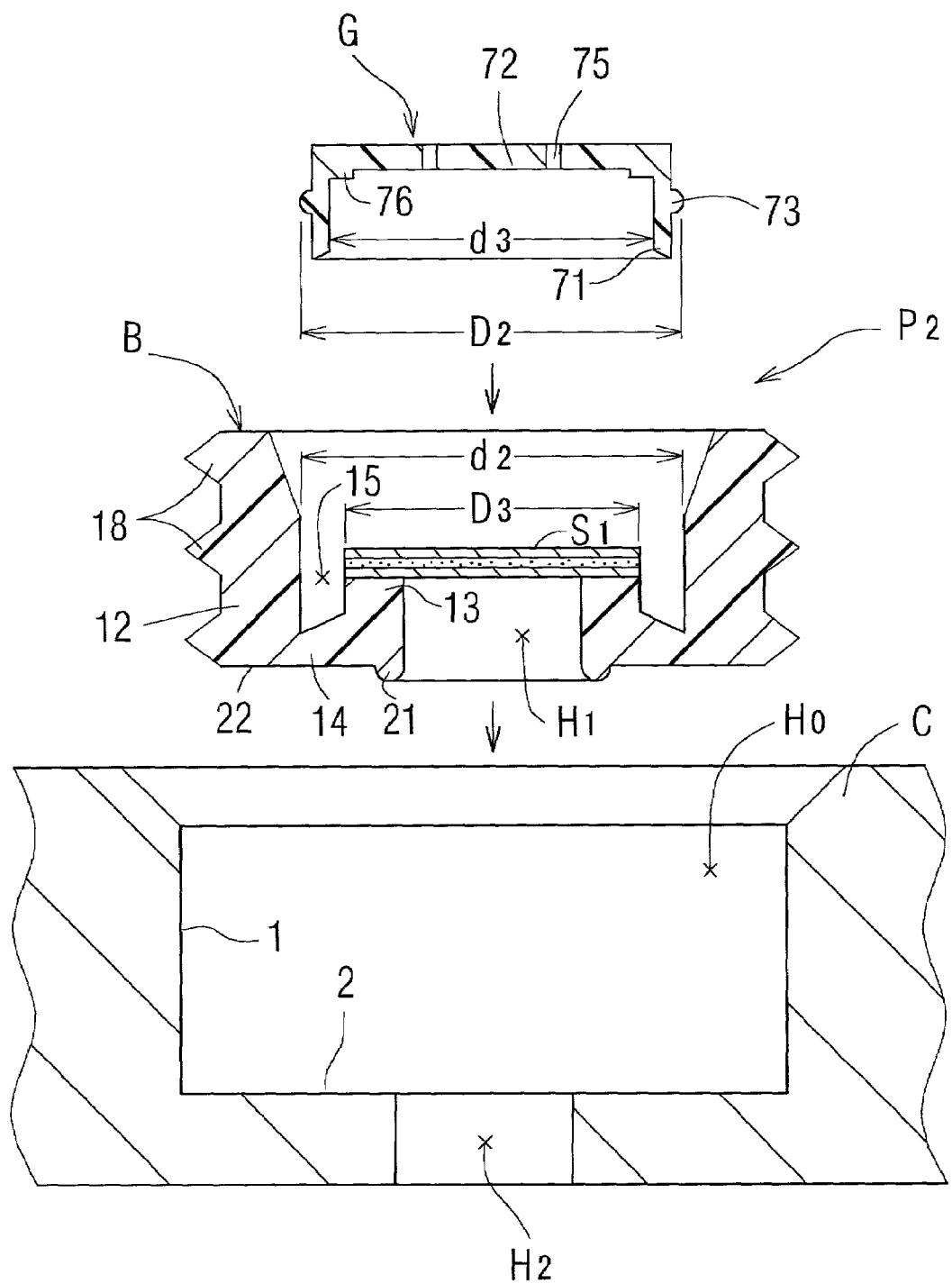
FIG. 11 is a sectional view showing a state before the gas-permeable plug $P_2$ is inserted into the insertion hole $H_0$ of the casing C.
Figure 12:
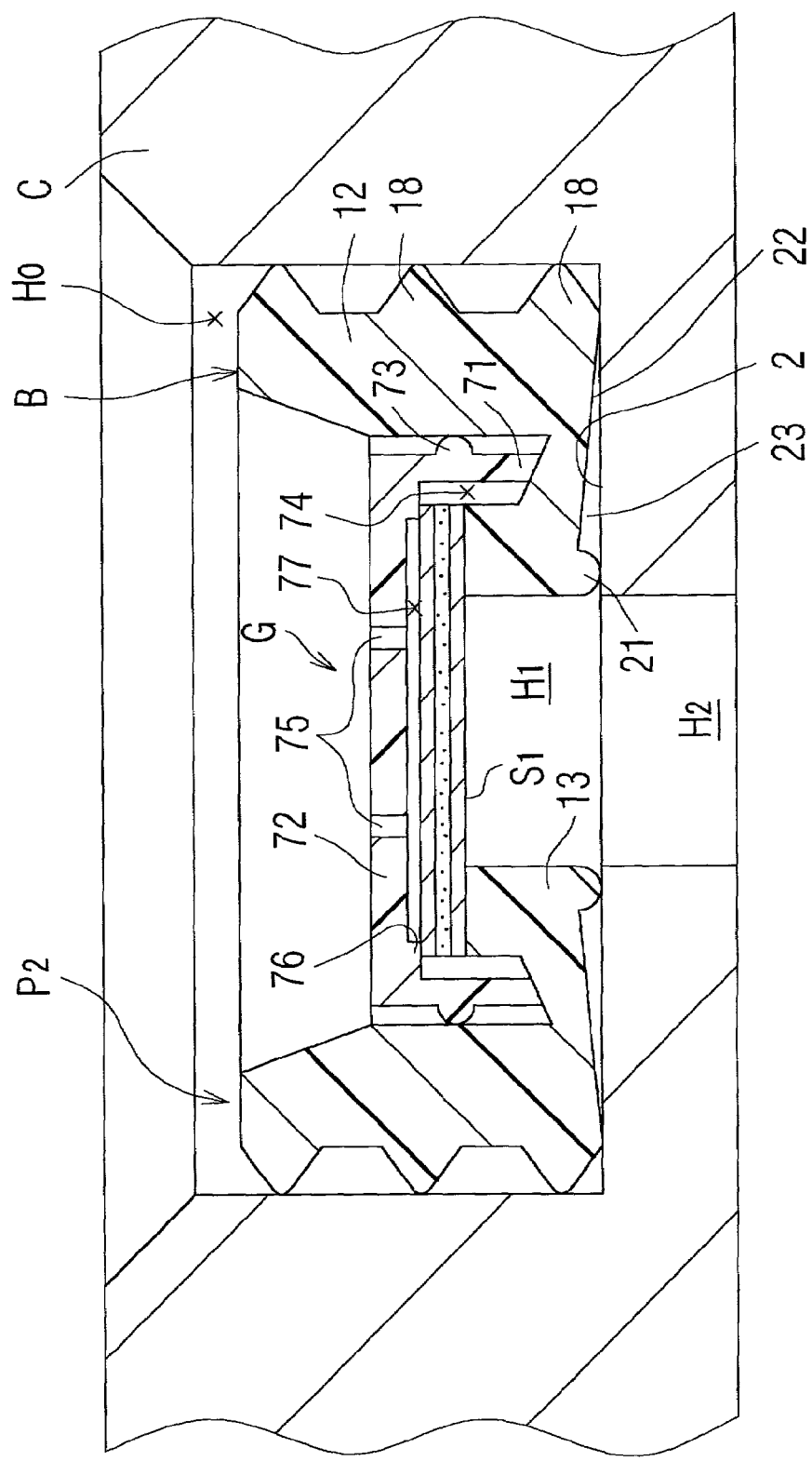
FIG. 12 is a sectional view (enlarged sectional view along line X-X of FIG. 1) after the insertion.

In a gas-permeable plug $P_2$ of a second embodiment of the invention shown in FIGS. 10 to 12, a reinforcing body G of a bottom-closed cylindrical shape is fitted to the outside of a sheet bonding portion 13 of a plug body B to prevent incidental deformation of the sheet bonding portion 13, and the occurrence of the foregoing disadvantage is prevented. FIG. 10 is a perspective view in which a part of the gas-permeable plug $P_2$ of the second embodiment of the invention is cut away. FIG. 11 is a sectional view showing a state before the gas-permeable plug $P_2$ is inserted into an insertion hole $H_0$ of a casing C. FIG. 12 is a sectional view (enlarged sectional view taken along line X-X of FIG. 1) after the insertion.

The gas-permeable plug $P_2$ of the second embodiment of the invention is constituted by a permeable sheet $S_1$ closing the portion of the vent hole $H_1$ of the plug body B, and the reinforcing body G of the bottom-closed cylindrical shape to protect the sheet bonding portion 13 of the plug body B to prevent deformation of the permeable sheet $S_1$ integrally bonded to the sheet bonding portion 13. In FIGS. 10 to 12, since the plug body B and the permeable sheet $S_1$ are equal to those of the gas-permeable plug $P_1$ of the first embodiment, a duplicate explanation is avoided, and only illustration is made. The structure of the reinforcing body G constituting the feature of the gas-permeable plug $P_2$ of the second embodiment and its operation will be described in detail.

The reinforcing body G of the bottom-closed cylindrical shape is constituted by a cylindrical tubular portion 71 fitted in an annular groove 15 of the plug body B and in elastic contact with an inner peripheral surface of a body portion 12, and a cover portion 72 integrally formed with the tubular portion 71, forming its bottom, and covering the outside of the permeable sheet $S_1$. An annular press portion 73 is integrally formed on the outer peripheral surface of the tubular portion 71, and the outer diameter ($D_2$) of the annular press portion 73 is equal to or slightly larger than the inner diameter ($d_2$) of the body portion 12 of the plug body B. The inner diameter ($d_3$) of the tubular portion 71 of the reinforcing body G is larger than the outer diameter ($D_3$) of the sheet bonding portion 13 of the plug body B, and in a state where the reinforcing body G is fitted in the annular groove 15 of the plug body B, a predetermined gap 74 is formed between the inner peripheral surface of the tubular portion 71 of the reinforcing body G and the outer peripheral surface of the sheet bonding portion 13 of the plug body B.

A plurality of small vent holes 75 which are smaller than a vent hole $H_1$ of the plug body B are formed in a cover portion 72 of the reinforcing body G at equal intervals along a circumference concentric with the vent hole $H_1$ of the plug body B. The cover portion 72 is made gas-permeable by the small vent holes 75. An annular projection 76 contacting to the outer peripheral edge portion of the permeable sheet $S_1$ integrally bonded to the sheet bonding portion 13 of the plug body B is integrally formed at the rear side outer peripheral edge of the cover portion 72 of the reinforcing body G. Thus, in the state where the reinforcing body G is fitted in the annular groove 15 of the plug body B, and the annular projection 76 of a flat ring shape of the outer peripheral edge portion of the rear surface of the cover portion 72 contacts the surface of the permeable sheet $S_1$, a predetermined permeable gap 77 is formed between most of the remainder of the cover portion 72, except for the outer peripheral edge portion of the cover portion 72 and the surface of the permeable sheet $S_1$, the permeability of the permeable sheet $S_1$ is not lowered, and damage to the permeable sheet $S_1$ is prevented.

As long as a molding material of the reinforcing body G is harder than the plug body B and has rigidity, the molding material is not particularly limited. As a typical material of the reinforcing body G, a hard general-purpose synthetic resin (ABS, PP, etc.), engineering synthetic resin (PC, PPO, PA, PBT, etc.), super engineering synthetic resin (PPS, etc.) can be used, and the reinforcing body G is formed of an injection molded product, or an extrusion molded product of the resin. Incidentally, as in the embodiment, as long as the cover portion 72 is integrally included, the injection molded product is desirable. Further, as a material of the reinforcing body G, other than the synthetic resin, a metal tube or a press formed product of a sheet metal is also one of the preferable examples.

Although assembling of the reinforcing body G to the plug body B may be made at any time before it is inserted in the insertion hole of the attachment object, it is preferable to perform the assembly immediately after molding of the plug body B. The reason for this is that when the reinforcing body G is assembled immediately after the molding of the plug body B, it is possible to prevent the occurrence of deformation during, not to mention the work of inserting the gas-permeable plug $P_2$ into the insertion hole of the attachment object, handling, such as transportation of the gas-permeable plug $P_2$.

Then, when the outer diameter ($D_2$) of the annular press portion 73 provided at the tubular portion 71 of the reinforcing body G is set to be slightly larger than the inner diameter ($d_2$) of the body portion 12, after the gas-permeable plug $P_2$ is inserted in the insertion hole $H_0$ of the motor casing C, the annular press portion 73 of the reinforcing body G presses the inner peripheral surface of the body portion 12 of the plug body B outward in the radial direction, and the body portion 12 is compressed. As a result, since the annular elastic contact portion 18 of the outer peripheral surface of the plug body B strongly comes in elastic contact with the inner peripheral surface of the insertion hole $H_0$ of the motor casing C, the seal property between both is raised, and it is possible to more effectively prevent water or the like from infiltrating into the inside of the motor casing C.

As in the above embodiment, it is preferable that the annular press portion 73 integrally molded on the outer peripheral surface of the tubular portion 71 of the reinforcing body G is disposed (formed) to be positioned between the plurality of annular elastic contact portions 18 integrally formed at predetermined intervals in the axial direction on the outer peripheral portion of the plug body B in the state where it is assembled in the casing C, as shown in FIG. 12. By this, in the state where the gas-permeable plug $P_2$ is inserted in the insertion hole $H_0$ of the attachment object (motor casing C), a press force is exerted on the body portion 12 of the plug body B between the adjacent annular elastic contact portions 18 viewed in the vertical section, and consequently, the press force of the annular elastic contact portions 18 to the inner peripheral surface of the insertion hole $H_0$ is increased. Therefore, the seal property of the gas-permeable plug $P_2$ is further improved. When the reinforcing body G is fitted into the plug body B of the gas-permeable plug $P_2$, since only the top of the annular press portion 73 of the reinforcing body G partially contacts, insertion friction resistance becomes low, and the insertion work becomes easy, and after the gas-permeable plug $P_2$ is inserted into the insertion hole $H_0$ of the attachment object (motor casing C), the reinforcing body G does not fall off of the plug body B by the friction due to a reaction force generated from the pressing of the annular press portion 73 partially biting the inner peripheral surface of the body portion 12 of the plug body B.

Although it is not always necessary that the reinforcing body G be integrally provided with the cover portion 72 (even if the cover portion 72 is not provided, the operation and effect can be obtained), it is preferable to integrally provide the cover portion 72 and to form the small vent holes 75 in the cover portion 72. With this structure, a chance that matter, such as a rotating tool like screw driver comes into direct contact with the permeable sheet $S_1$ becomes low, and the permeable sheet $S_1$ is protected. Consequently, unexpected damage is prevented. Protection of the permeable sheet $S_1$ against the external matter is also obtained, not only during the insertion work into the insertion hole of the attachment object, but also during handling such as during transportation or repair work.

As in the above embodiment, it is preferable to provide the annular projection 76 at the outer peripheral edge of the rear surface side of the cover portion 72. By the existence of the annular projection 76, the predetermined vent space 77 is formed between the rear surface of the cover portion 72 of the reinforcing body G and the surface (outer surface) of the permeable sheet $S_1$, and stable permeability is secured. When the reinforcing body G is fitted into the plug body B, even if an excessive fitting force is exerted, the cover portion 72 does not come in direct contact with the permeable sheet $S_1$, and excessive attention is not required at the time of fitting work. Especially, in the case where a flash due to molding is generated on the periphery of the inside opening of the small vent hole 75 formed in the cover portion 72, a fear that the flash damages the portion communicating with the vent hole $H_1$ of the plug body B in the permeable sheet $S_1$ is lowered.

Incidentally, although the gas-permeable plug of the invention can be typically applied to a motor casing, the invention is not limited to this, but can be applied to various casings exposed to the outer air, for example, a head lamp housing for motor vehicles, a casing of a street lamp, and other equipment housings or casings for the same purpose.

In the case where the gas-permeable plug of the invention is inserted in an insertion hole of a casing, although the casing is permeable between its inside and its outside, a water droplet or an oil droplet having a specific size or larger, dust or the like does not infiltrate into the casing, so that erroneous operation, corrosion or the like of equipment housed in the casing can be prevented.

In the case of the gas-permeable plug provided with the reinforcing body to reinforce the sheet bonding portion of the plug body, when the plug is inserted in the insertion hole of an attachment object, damage and deterioration of the bonding portion of the permeable sheet and the permeable sheet itself can be prevented.

Further, in the method for manufacturing the gas-permeable plug according to the invention, at the time of injection molding, part of molten resin for molding of the plug body is made to enter the minute permeable pores and/or permeable gaps of the permeable sheet in a pressed state, so that at the same time as the molding of the plug body, the permeable sheet is integrally bonded to a part of the plug body with a strong fixing force. Thus, the bonding portion of the permeable sheet integrally bonded to the plug body becomes consistent for a long period, so that the original function of the permeable sheet (permeation function between the inside and the outside, function of preventing infiltration of a water droplet or the like from the outside) can be performed for a long term with certainty.

What is claimed is:

1. A gas-permeable plug for inserting into an insertion hole formed through a part of a casing in an inward-outward direction of the casing, the gas-permeable plug comprising:
   a plug body; and
   a gas-permeable and liquid impermeable sheet including therein a plurality of minute permeable pores having irregular shapes and directed in irregular directions and/or a plurality of fine permeable gaps having irregular shapes and directed in irregular directions, wherein:
   the plug body comprises a material having rubber-like elasticity;
   the plug body has a vent hole formed at a center portion of the plug body in the inward-outward direction of the casing;
   the plug body has a sheet bonding portion formed outside of the vent hole;
   the plug body has a substantially ring shape or a substantially tubular shape having an outer shape slightly larger than an inner shape of the insertion hole;
   the gas-permeable and liquid impermeable sheet is integrally bonded with the sheet bonding portion by mechanical engagement during formation of the plug body such that at least a portion of the minute permeable pores and/or the fine permeable gaps of the gas-permeable and liquid impermeable sheet at the sheet bonding portion has the material of the plug body solidified in irregular shapes and irregular directions therein; and
   a portion of the gas-permeable and liquid impermeable sheet is compressed in a thickness direction over a full area of the sheet bonding portion of the plug body and is thinner than an original thickness of the gas-permeable and liquid impermeable sheet,
   wherein the gas-permeable and liquid impermeable sheet has an annular compressed portion located inside of the portion of the gas-permeable and liquid impermeable sheet at the sheet bonding portion, the annular compressed portion being compressed in the thickness direction and being thinner than the original thickness of the gas-permeable and liquid impermeable sheet.

2. A gas-permeable plug according to claim 1, wherein
the plug body has an annular groove at an outer peripheral side of the sheet bonding portion, the annular groove having a bottom surface positioned closer to an inside of the casing than the gas-permeable and liquid impermeable sheet; and
the plug body has an annular thin coupling portion for coupling the sheet bonding portion and a body portion of an outermost periphery of the plug body.

3. A gas-permeable plug according to claim 2, wherein the plug body has a projection projecting to the inside of the casing at an inner end surface of the plug body and at a portion of the plug body adjacent to the vent hole.

4. A gas-permeable plug according to claim 1, wherein the gas-permeable and liquid impermeable sheet comprises a permeable sheet body singly bonded with the sheet bonding portion.

5. A gas-permeable plug according to claim 1, wherein
the gas-permeable and liquid impermeable sheet comprises at least one backing sheet including a plurality of fine permeable gaps directed in irregular directions and a permeable sheet body, the backing sheet being laminated on a surface of the permeable sheet body; and
at least a portion of the fine permeable gaps of the backing sheet at the sheet bonding portion has the material of the plug body solidified therein, the backing sheet being fixed to the sheet bonding portion.

6. A gas-permeable plug according to claim 1, wherein the portion of the gas-permeable and liquid impermeable sheet at the sheet bonding portion is annular and continuous.

7. A gas-permeable plug according to claim 1, wherein the material of the plug body is thermoplastic elastomer resin material.

8. A gas-permeable plug according to claim 1, wherein the casing is of an electric motor in a vehicle.

9. A gas-permeable plug according to claim 1, wherein the annular compressed portion is thinner than the portion of the gas-permeable and liquid impermeable sheet at the sheet bonding portion.

10. A gas-permeable plug for inserting into an insertion hole formed through a part of a casing in an inward-outward direction of the casing, the gas-permeable plug comprising:
a gas-permeable and liquid impermeable sheet including therein a plurality of minute permeable pores having irregular shapes and directed in irregular directions and/or a plurality of fine permeable gaps having irregular shapes and directed in irregular directions;
a plug body having a sheet bonding portion to which the gas-permeable and liquid impermeable sheet is integrally bonded; and
a substantially tubular reinforcing body for reinforcing the sheet bonding portion of the plug body, wherein:
the plug body comprises a material having rubber-like elasticity;
the plug body has a vent hole formed at a center portion of the plug body in the inward-outward direction of the casing, the sheet bonding portion being formed outside of the vent hole;
the plug body has an annular groove formed outside of the sheet bonding portion for the substantially tubular reinforcing body;
the plug body has a substantially ring shape or a substantially tubular shape having an outer shape slightly larger than an inner shape of the insertion hole;
the gas-permeable and liquid impermeable sheet is integrally bonded with the sheet bonding portion by mechanical engagement during formation of the plug body such that at least a portion of the minute permeable pores and/or the fine permeable gaps of the gas-permeable and liquid impermeable sheet at the sheet bonding portion has the material of the plug body solidified in irregular shapes and irregular directions therein;
the substantially tubular reinforcing body is fitted to an outside of the sheet bonding portion of the plug body and disposed in the annular groove; and
a portion of the gas-permeable and liquid impermeable sheet is compressed in a thickness direction over a full area of the sheet bonding portion of the plug body and is thinner than an original thickness of the gas-permeable and liquid impermeable sheet,
wherein the gas-permeable and liquid impermeable sheet has an annular compressed portion located inside of the portion of the gas-permeable and liquid impermeable sheet at the sheet bonding portion, the annular compressed portion being compressed in the thickness direction and being thinner than the original thickness of the gas-permeable and liquid impermeable sheet.

11. A gas-permeable plug according to claim 10, wherein the substantially tubular reinforcing body has a substantially bottom-closed cylindrical shape including a cover portion integrally provided, the cover portion covering an outside of the gas-permeable and liquid impermeable sheet.

12. A gas-permeable plug according to claim 11, wherein the cover portion of the substantially tubular reinforcing body has a small vent hole formed therein.

13. A gas-permeable plug according to claim 10, wherein the portion of the gas-permeable and liquid impermeable sheet at the sheet bonding portion is annular and continuous.

14. A gas-permeable plug according to claim 10, wherein the annular compressed portion is thinner than the portion of the gas-permeable and liquid impermeable sheet at the sheet bonding portion.

* * * * *